(12) United States Patent
Kao et al.

(10) Patent No.: US 12,131,974 B2
(45) Date of Patent: Oct. 29, 2024

(54) SEMICONDUCTOR PACKAGE AND METHOD OF MANUFACTURING SEMICONDUCTOR PACKAGE

(71) Applicant: Taiwan Semiconductor Manufacturing Company, Ltd., Hsinchu (TW)

(72) Inventors: Chin-Fu Kao, Taipei (TW); Chen-Shien Chen, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 396 days.

(21) Appl. No.: 17/353,798

(22) Filed: Jun. 21, 2021

(65) Prior Publication Data

US 2022/0301970 A1    Sep. 22, 2022

Related U.S. Application Data

(60) Provisional application No. 63/163,064, filed on Mar. 19, 2021.

(51) Int. Cl.
*H01L 23/367* (2006.01)
*H01L 21/48* (2006.01)
(Continued)

(52) U.S. Cl.
CPC ...... *H01L 23/3675* (2013.01); *H01L 21/4882* (2013.01); *H01L 21/54* (2013.01);
(Continued)

(58) Field of Classification Search
CPC . H01L 23/3675; H01L 21/4882; H01L 21/54; H01L 23/18; H01L 23/49816;
(Continued)

(56) References Cited

U.S. PATENT DOCUMENTS

| 8,993,380 | B2 | 3/2015 | Hou et al. |
| 9,281,254 | B2 | 3/2016 | Yu et al. |

(Continued)

FOREIGN PATENT DOCUMENTS

TW    202002226    1/2020

OTHER PUBLICATIONS

"Office Action of Taiwan Counterpart Application", issued on Jun. 29, 2022, p. 1-p. 7.
(Continued)

*Primary Examiner* — Benjamin Tzu-Hung Liu
(74) *Attorney, Agent, or Firm* — JCIPRNET

(57) ABSTRACT

A semiconductor package includes a substrate, a package structure, a lid structure, and a thermal spreader layer. The package structure is disposed on the substrate, wherein the package structure includes a plurality of device dies and a filling material filling a gap between adjacent two of the plurality of device dies. The lid structure is disposed over substrate and covering the package structure. The thermal spreader layer is disposed between the lid structure and the package structure, wherein the thermal spreader layer has a profile that is discontinuous in thickness at a gap region corresponding to the gap.

20 Claims, 34 Drawing Sheets

(51) Int. Cl.
*H01L 21/54* (2006.01)
*H01L 23/00* (2006.01)
*H01L 23/18* (2006.01)
*H01L 23/498* (2006.01)
*H01L 25/065* (2023.01)

(52) U.S. Cl.
CPC ........ *H01L 23/18* (2013.01); *H01L 23/49816* (2013.01); *H01L 23/49822* (2013.01); *H01L 23/49833* (2013.01); *H01L 23/49838* (2013.01); *H01L 24/16* (2013.01); *H01L 24/73* (2013.01); *H01L 25/0655* (2013.01); *H01L 2224/16235* (2013.01); *H01L 2224/73204* (2013.01); *H01L 2924/1431* (2013.01); *H01L 2924/1434* (2013.01); *H01L 2924/16152* (2013.01); *H01L 2924/16251* (2013.01); *H01L 2924/182* (2013.01)

(58) Field of Classification Search
CPC ......... H01L 23/49822; H01L 23/49833; H01L 23/49838; H01L 24/16; H01L 24/73; H01L 25/0655; H01L 2224/16235; H01L 2224/73204; H01L 2924/1431; H01L 2924/1434; H01L 2924/16152; H01L 2924/16251; H01L 2924/182
See application file for complete search history.

(56) References Cited

U.S. PATENT DOCUMENTS

| | | | |
|---|---|---|---|
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 2018/0350754 | A1* | 12/2018 | Huang ................ H01L 25/0655 |
| 2020/0219786 | A1 | 7/2020 | Jung et al. |
| 2021/0233832 | A1* | 7/2021 | Uppal ................ H01L 23/3737 |

OTHER PUBLICATIONS

"Office Action of Taiwan Counterpart Application", issued on Apr. 8, 2022, p. 1-p. 4.

* cited by examiner

SEMICONDUCTOR PACKAGE AND METHOD OF MANUFACTURING SEMICONDUCTOR PACKAGE

CROSS-REFERENCE TO RELATED APPLICATION

This application claims the priority benefit of U.S. provisional applications Ser. No. 63/163,064, filed on Mar. 19, 2021. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
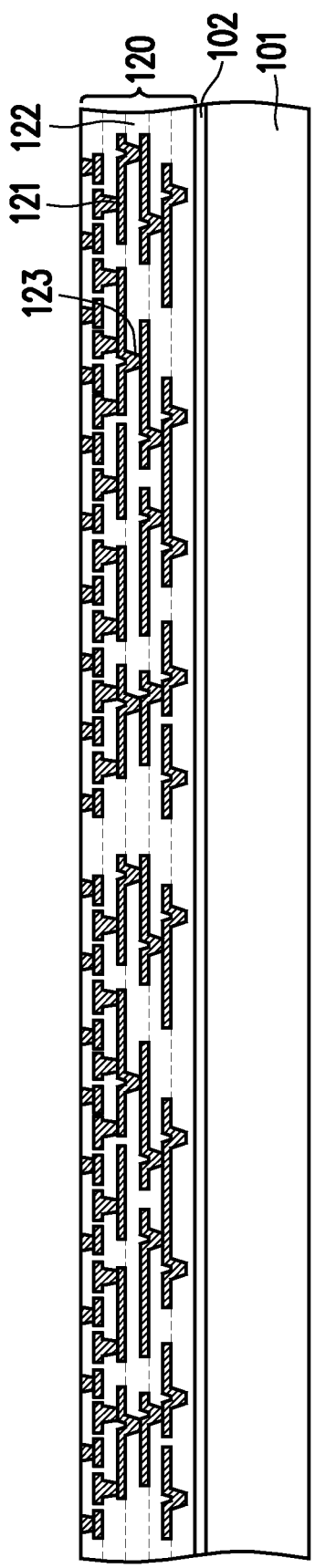
FIG. 1 to FIG. 13 illustrates a cross sectional views of intermediate stages in the manufacturing of a semiconductor package according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor package and the method of manufacturing a semiconductor package are provided in accordance with various exemplary embodiments. Before addressing the illustrated embodiments specifically, certain advantageous features and aspects of the present disclosed embodiments will be addressed generally. Described below is a semiconductor package including a package structure with a plurality of device dies over a redistribution structure, and the package structure is bonded to a substrate. In addition, the lid structure is disposed over the substrate and the package structure through a thermal spreader layer, wherein the thermal spreader layer has a profile that is discontinuous in thickness at a region that is corresponding to (e.g., aligned with) the gap between the device dies. In some embodiments, the thickness of the region above gap is substantially thinner than the thickness of other region of the thermal spreader layer.

Generally, there may exist coefficient of thermal expansion (CTE) mismatch between the material typically used for the lid structure (e.g., metal), the material typically used for the semiconductor device (e.g., silicon) and the material used for the substrate (e.g., Ajinomoto Build-up Film, ABF, glass fiber). The CTE mismatch between these materials may cause thermal stress on the device dies, which may result in die crack or delamination between the device dies and the filling material. For high-power products design, higher thermal conductive materials such as metal thermal interface material (metal TIM) is applied to the semiconductor package as the thermal spreader layer due to high-K performance of metal. However, the metal TIM generally has higher young's modulus, which would easily induce die crack or delamination between the device dies and the filling material. Accordingly, with the arrangement of the thermal spreader layer having a discontinuous thickness profile, certain thermal stress among the device dies can be released with thinner thermal spreader layer applied above the gap between device dies. The intermediate stages of forming the semiconductor package are illustrated in accordance with some embodiments. Some variations of some embodiments are discussed. Throughout the various views and illustrative embodiments, like reference numbers are used to designate like elements.

FIG. 1 to FIG. 13 illustrates a cross sectional views of intermediate stages in the manufacturing of a semiconductor package according to some embodiments of the present disclosure. In some embodiments, a package structure 100 shown in FIG. 10 may be provided on a substrate 200. The package structure 100 may include a plurality of device dies 110 and a filling material 170 fills at least one gap between adjacent two of the device dies 110. FIG. 1 to FIG. 9 illustrates one of the possible methods of manufacturing the package structure 100 shown in FIG. 10. However, the disclosure is not limited thereto. Other suitable packages and component configurations may also be applied. The package structure 100 may be in a wafer form (a reconstructed wafer) in the process. The formation of the package structure 100 may include the following steps.

Referring to FIG. 1, in some embodiments, a redistribution structure 120 described above is formed on a carrier 101. In some embodiments, the carrier 101 includes, for example, silicon based materials, such as glass or silicon oxide, or other materials, such as aluminum oxide, combinations of any of these materials, or the like. The carrier 101 is planar in order to form the redistribution structure 120 thereon and accommodate an attachment of device dies 110 (not illustrated in FIG. 1 but illustrated and described below with respect to FIG. 3). In some embodiments, an adhesive layer 102 may be placed on the carrier 101 in order to assist in the adherence of overlying structures (e.g., the redistribution structure 120). In an embodiment the adhesive layer 102 may include an ultra-violet glue, which loses its adhesive properties when exposed to ultra-violet light. However, other types of adhesives, such as pressure sensitive adhesives, radiation curable adhesives, epoxies, an Ajinomoto build-up film (ABF), combinations of these, or the like, may also be used. The adhesive layer 102 may be placed onto the carrier 101 in a semi-liquid or gel form, which is readily deformable under pressure.

In accordance with some embodiments of the disclosure, the redistribution structure 120 is formed over the carrier 101 and the adhesive layer 102 (if any). In some embodiments, the redistribution structure 120 may be formed by depositing conductive layers, patterning the conductive layers to form a plurality of redistribution lines (e.g., the redistribution lines 121). The redistribution lines are at least partially covered with dielectric layers (e.g., dielectric layer 122) and the dielectric layers fill the gaps between the redistribution lines and the conductive lines. The vias (e.g., the via 123) are located on the layers of the redistribution structure 120 respectively and extending through the corresponding dielectric layers for interconnecting the redistribution lines at different layers. The material of the redistribution lines may include a metal or a metal alloy including aluminum, copper, tungsten, and/or alloys thereof.

In detail, a seed layer, such as a copper, titanium, or the like, may be deposited over the carrier 101, such as by sputtering or another physical vapor deposition (PVD) process. A photo resist is deposited on the seed layer and patterned to expose portions of the seed layer by photolithography. The pattern is for a metallization layer on the redistribution structure 120. Conductive material of the redistribution lines and the conductive lines, such as copper, aluminum, the like, or a combination thereof, is deposited on the exposed seed layer, such as by electroless plating, electroplating, or the like. The photoresist is removed by an ash and/or flush process. The exposed seed layer removed, such as by a wet or dry etch. The remaining conductive material forms a metallization layer (e.g., the redistribution lines) of the redistribution structure 120. A dielectric layer is deposited over the metallization layer. The material of the dielectric layer may include polymer such as a polyimide, polybenzoxazole (PBO), benzocyclobutene (BCB), the like, or a combination thereof. The dielectric layer can be deposited by a coating process, a lamination process, the like, or a combination thereof. Vias may be formed through the dielectric layer to the metallization layer using acceptable photolithography techniques.

Subsequent metallization layers and dielectric layers may be formed using the same or similar processes as discussed. Conductive material deposited during the formation of a subsequent metallization layer may be deposited in openings of the previously formed dielectric layers to form vias for electrically connecting respective metallization layers. After forming the topmost dielectric layer, via is formed through the topmost dielectric layer for connectors coupled between the redistribution lines, and another semiconductor device, package, die, and/or another substrate. It should be noted that any number of metallization layers and dielectric layers may be formed, and the redistribution structure 120 in this embodiment is illustrated as an example.

Figure 2:
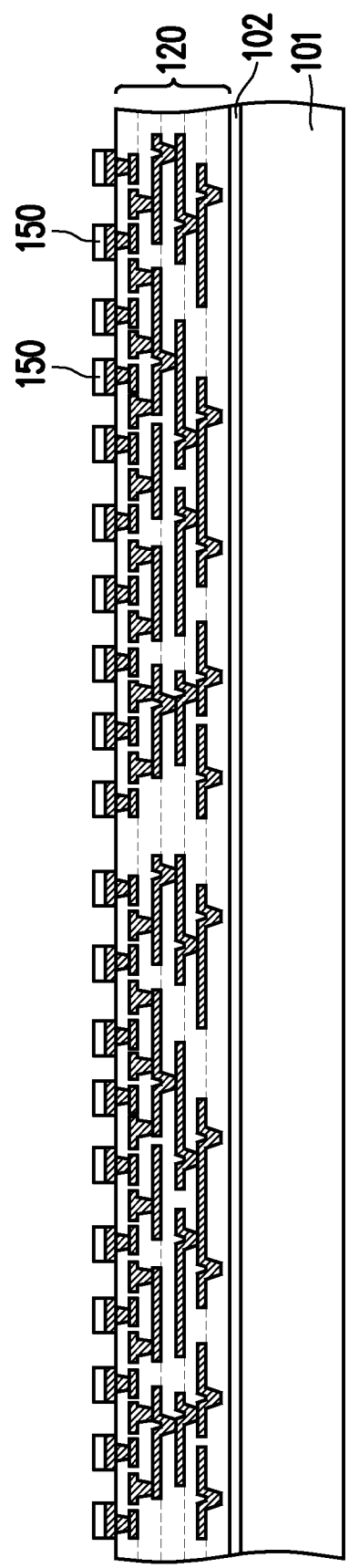

With now reference to FIG. 2, in some embodiments, after the redistribution structure 120 is formed, the conductive bumps 150 are provided over the redistribution structure 120. In some embodiments, the conductive bumps 150 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. In the present embodiment, the conductive bumps are micro bumps, for example, and each of the conductive bumps 150 may include a solder layer formed above a copper seed layer. An optional nickel layer may be in between the solder layer and the copper seed layer. The copper seed layer and the nickel layer may act as an UBM and a barrier layer for the formation of solder layer. The solder layer may include an electrically conductive solder material, e.g., Sn, Ni, Au, Ag, Cu, Bi, W, Fe, Ferrite, an alloy or combination thereof, or any other suitable material. One of ordinary skill in the art will recognize that there are many suitable arrangements of materials and layers suitable for the formation of the conductive bumps 150. Any suitable materials or layers of material that may be used for the conductive bumps 150 are fully intended to be included within the scope of the current embodiments.

Figure 3:
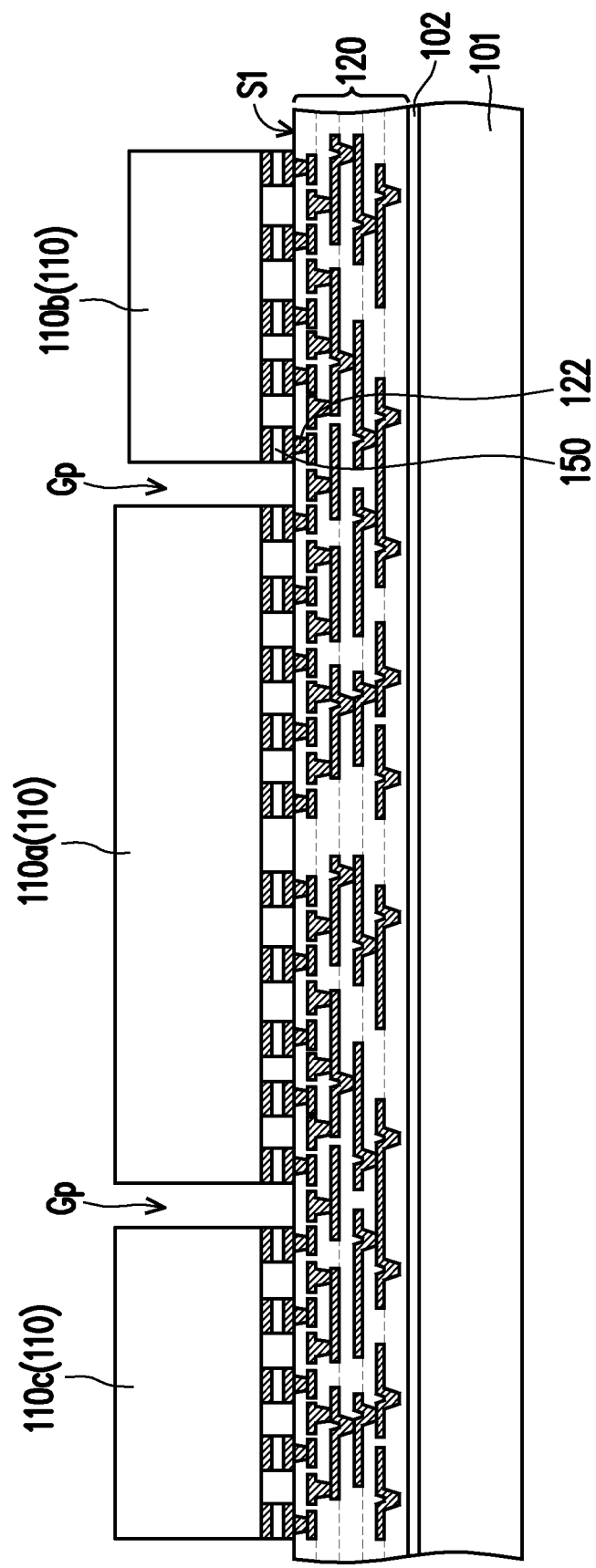

With now reference to FIG. 3, in some embodiments, at least one device die 110 is boned on a first side 51 of the redistribution structure 120, for example, through the conductive bumps 26 by flip-chip bonding technique. In some embodiments, more than one device dies 110 (e.g., device dies 110a, 110b, 110c) may be placed on the conductive bumps 150 using, for example, a pick-and-place tool. In the present embodiment, three device dies 110a, 110b, 110c are illustrated herein, but more or less device dies may be applied to the semiconductor package 10. The disclosure is not limited thereto. The device dies 110 are disposed on the carrier 101 in a side-by-side manner. Accordingly, at least one gap Gp exists between any two adjacent device dies 110. Herein, two gaps Gp are illustrated, but more or less gap may be applied according to the number of the device dies 110. In some embodiments, the device die 110a may be a logic die, such as a system on chip (SOC), a system on integrated chip (SoIC), application specific integrated circuit (ASIC), or the like. The device dies 110b, 110c may be memory dies, such as a DRAM die, SRAM die, or the like. Other types of dies may also be adopted, such power management dies (e.g., power management integrated circuit (PMIC) dies), radio frequency (RF) dies, sensor dies, micro-electro-mechanical-system (MEMS) dies, signal processing dies (e.g., digital signal processing (DSP) die), front-end dies (e.g., analog front-end (AFE) dies), transceiver (TRX) dies, the like, or a combination thereof. In addition, the device dies 110a, 110b, 110c may be in different sizes (e.g., different heights and/or surface areas), and in other embodiments, the device dies 110a, 110b, 110c may be in the same size (e.g., same heights and/or surface areas). In an embodiment, the device dies 110 are bonded to the first side S1 of the redistribution structure 120 by a reflow process. During this reflow process, the conductive bumps 150 are in contact with the device dies 110, and the pads (UBM layer) of the redistribution structure 120 to physically and electrically couple the device dies 110 to the redistribution structure 120.

Figure 4:
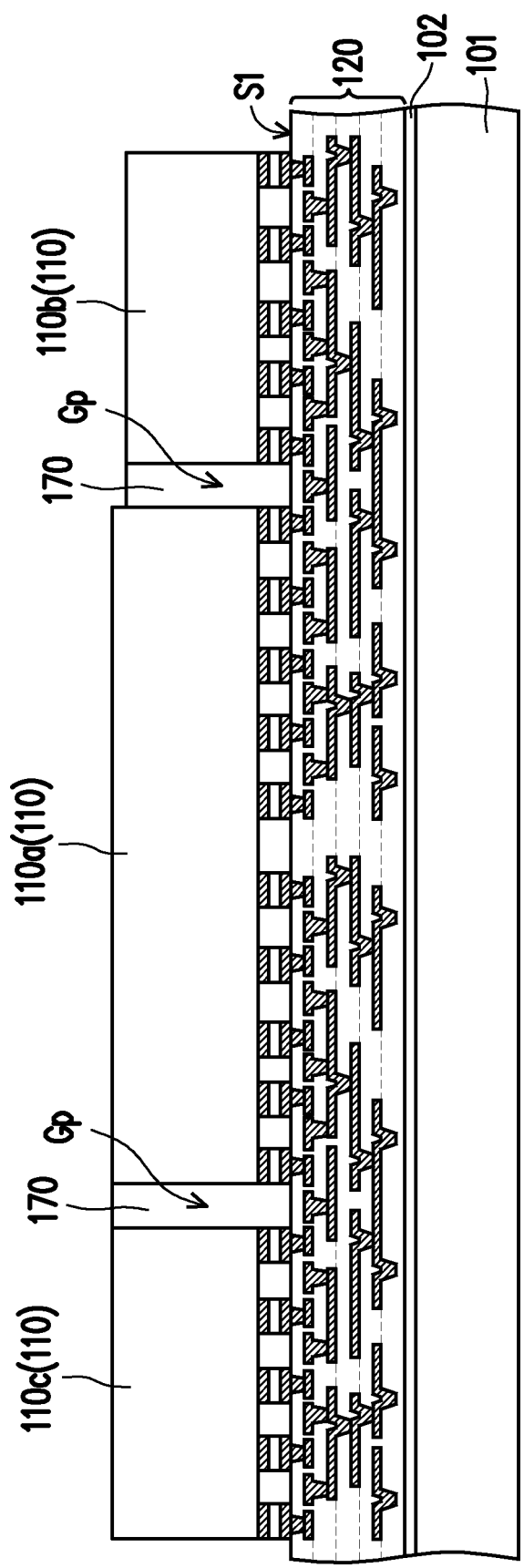

With now reference to FIG. 4, a filling material 170 is provided to at least fill the gaps Gp between the device dies 110. In an embodiment, the filling material 170 is dispensed into the gaps Gp between the device dies 110 and surrounding the conductive bumps 150. Then, a thermal process is performed to set (cure) the filling material 170. In some embodiments, the filling material 170 may extend up along sidewall of the device dies 110. The filling material 170 may be any acceptable material, such as a polymer, epoxy, molding underfill, or the like. In the present embodiment, the filling material includes underfill material, but the disclosure is not limited thereto. The filling material 170 may be formed by a capillary flow process after the device dies 110 are attached, or may be formed by a suitable deposition method before the device dies 110 are attached. In such embodiment, the filling material 170 fills the gaps Gp between the device dies 110, and may partially cover or not cover the outermost side surfaces of the device die 110 as it is shown in FIG. 5.

Figure 6:
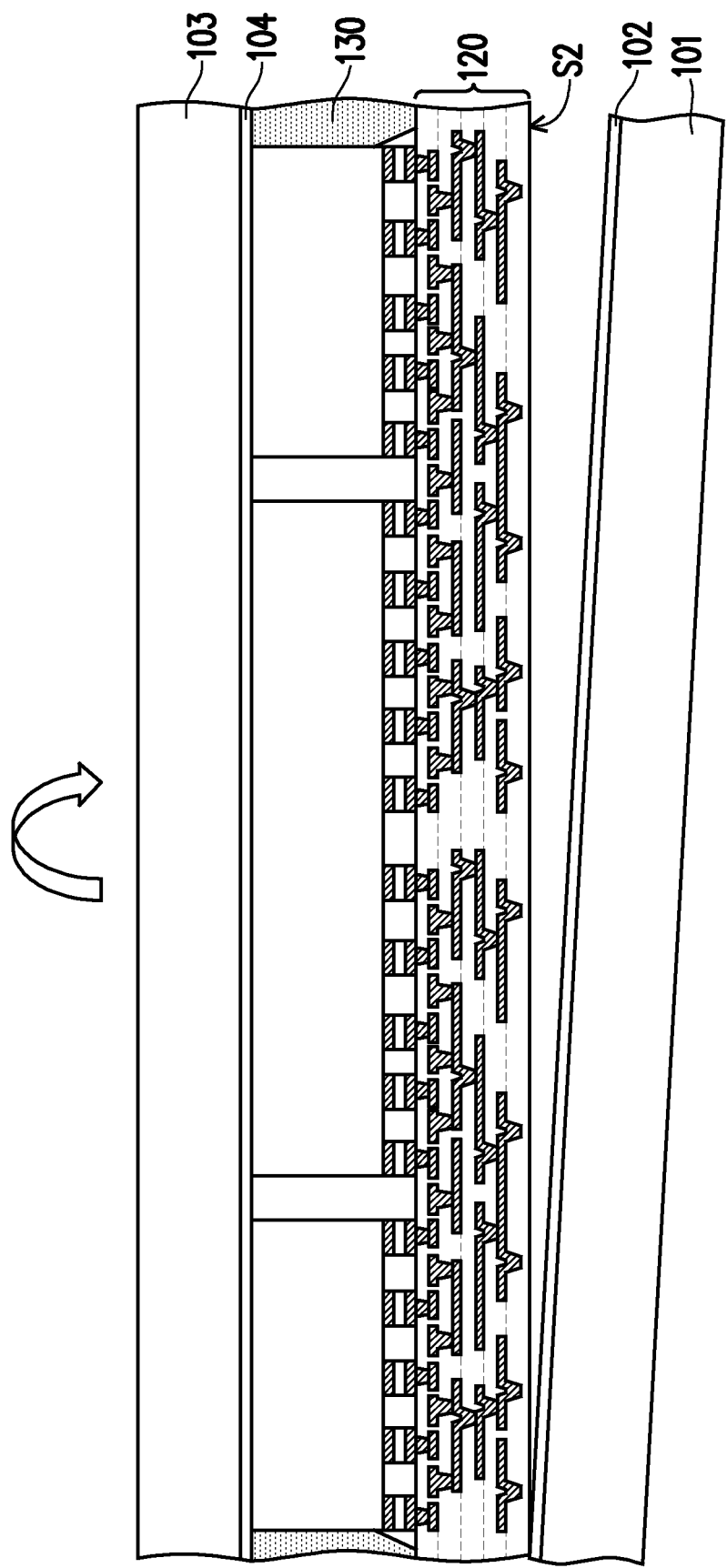

Referring to FIG. 6, an encapsulating material 130 may be optionally provided over the redistribution structure 120 to encapsulate the device dies 110 in accordance with some embodiments. Then, a thermal process is performed to set the encapsulating material 130. The encapsulating material 130 may include a molding compound, an epoxy, or a resin, etc. In some embodiments, a top surface of the encapsulating material 130 may be higher than back surfaces of the device dies 110. Namely, the encapsulating material 130 covers the back surfaces of the device dies 110.

Then, a thinning process, which includes a grinding process, may be performed to thin the encapsulating material 130 (and the filling material 170) until the back surfaces of the device dies 110 are revealed. The resulting structure is shown in FIG. 5. Due to the thinning process, the back surfaces of the device dies 110 are substantially level with the upper surfaces of the filling material 170, and are substantially level with the upper surface of the encapsulating material 130 as shown in FIG. 5. Throughout the description, the resultant structure including the device dies 110, the filling material 170, the encapsulating material 130 (optional), and the redistribution structure 120 as shown in FIG. 5 is referred to as a package wafer PK, which may have a wafer form in the process.

Figure 5:
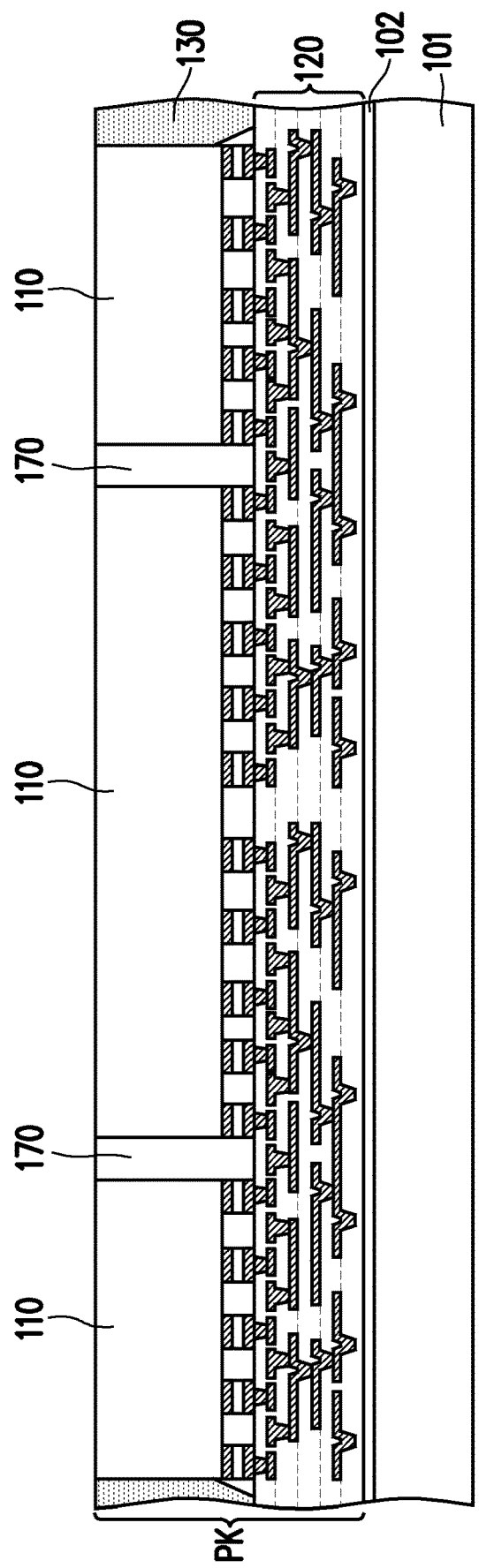

With now reference to FIG. 5 and FIG. 6, an upper side of the package wafer PK is now temporarily attached to another carrier 103 by an adhesive layer 104 for supporting the package wafer PK during subsequent processing. In some embodiments, the carrier 103 may be glass, ceramic, alumina, stainless steel or another material that provides adequate temporary support for the package wafer PK during processing. A demounting step is performed to remove the carrier 101 from a second side S2 of the redistribution structure 120. In some embodiments, the carrier 101 is detached from the second side S2 of the redistribution structure 120 by causing the adhesive layer 102 to lose or reduce adhesion. The adhesive layer 102 is then removed along with the carrier 101. For example, the adhesive layer 102 may be exposed to UV light, so that the adhesive layer 102 loses or reduces adhesion, and hence the carrier 101 and the adhesive layer 102 can be removed from the second side S2 of the redistribution structure 120. It is noted that the orientation in the figures is shown for purposes of illustration only, and the process could be performed with the structure oriented in another direction.

Figure 7:
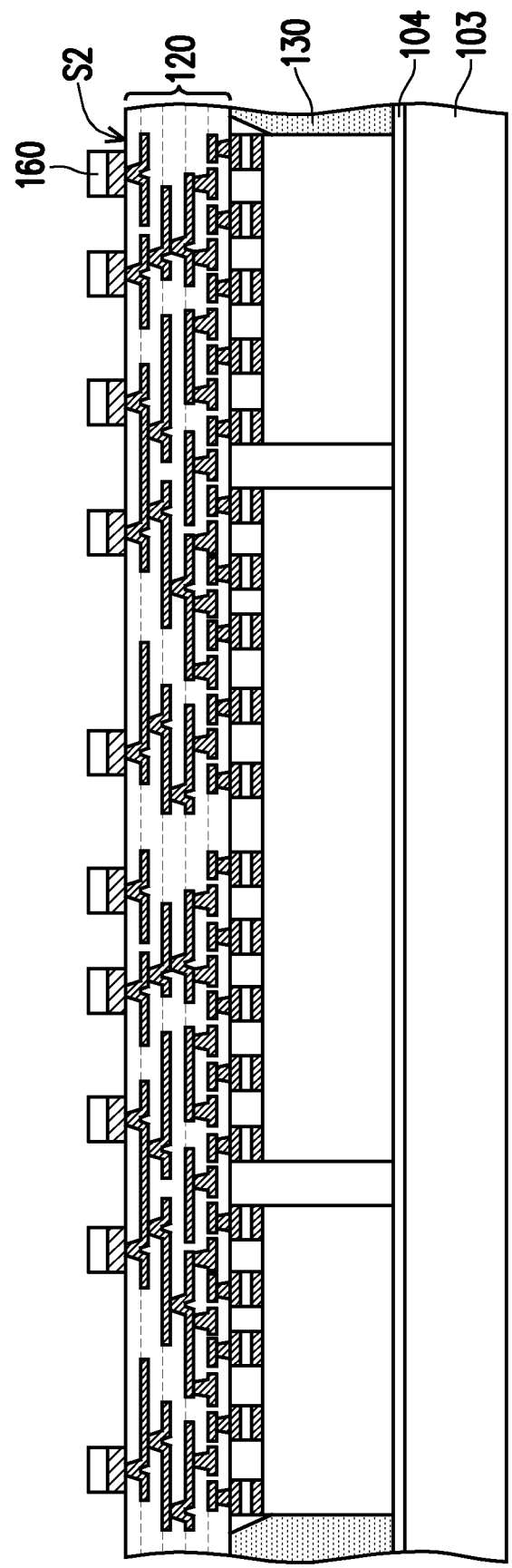

In FIG. 7, the orientation of the package wafer PK is flipped, and the connectors 160 are provided over the second side S2 of the redistribution structure 120. Again, the orientation in the figures is shown for purposes of illustration only, and the process could be performed with the structure oriented in another direction. In some embodiments, the connectors 160 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors 160 may include a conductive material such as solder, copper, aluminum, gold, nickel, silver, palladium, tin, the like, or a combination thereof. In some embodiments, the connectors 160 include a eutectic material and may comprise a solder bump or a solder ball, as examples. In some embodiments, a reflow process may be performed, giving the connectors 160 a shape of a partial sphere in some embodiments. Alternatively, the connectors 160 may comprise other shapes. The connectors 160 may also comprise non-spherical conductive connectors, for example. In some embodiments, the connectors 160 include metal pillars (such as a copper pillar) formed by a sputtering, printing, electro plating, electroless plating, CVD, or the like, with or without a solder material thereon. The metal pillars may be solder free and have substantially vertical sidewalls or tapered sidewalls. In the present embodiment, the connectors are C4 bumps, but the disclosure is not limited thereto.

Figure 8:
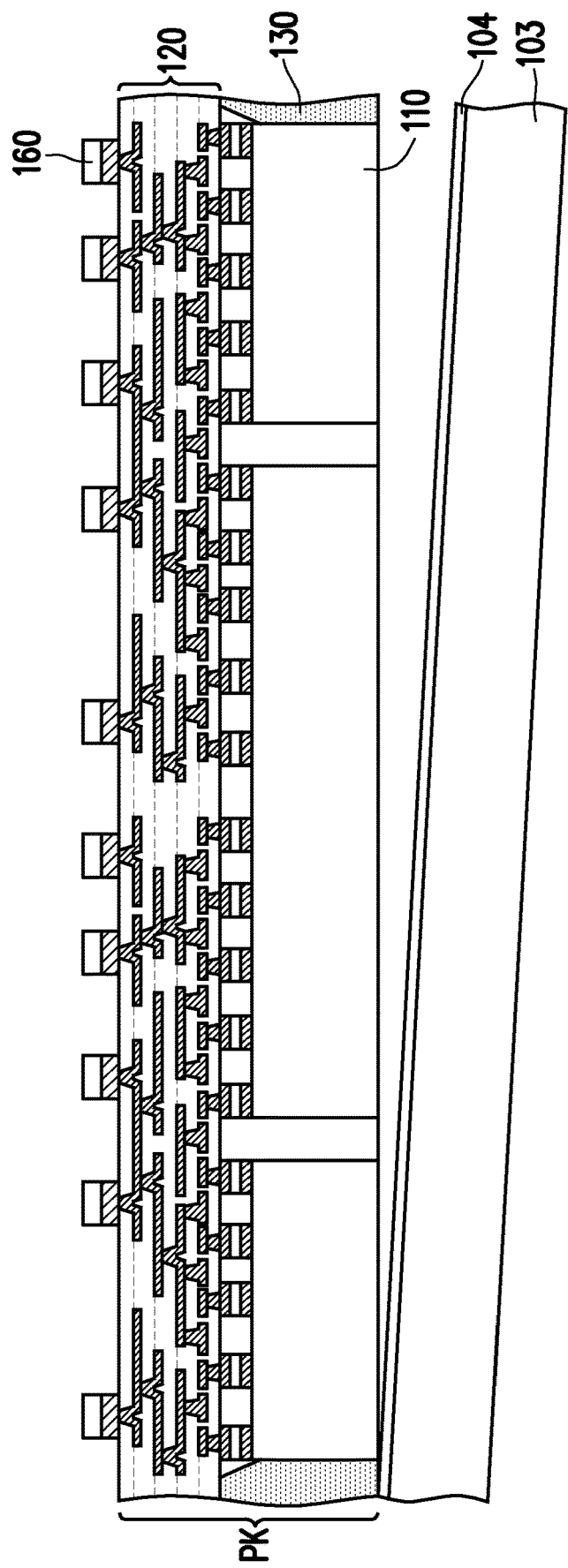

With now reference to FIG. 8, a demounting step is performed to remove the carrier 103 from the package wafer PK. In some embodiments, the carrier 103 is detached from the package wafer PK by causing the adhesive layer 104 to lose or reduce adhesion. The adhesive layer 104 is then removed along with the carrier 103. For example, the adhesive layer 104 may be exposed to UV light, so that the adhesive layer 104 loses or reduces adhesion, and hence the carrier 103 and the adhesive layer 104 can be removed from the package wafer PK.

Figure 9:
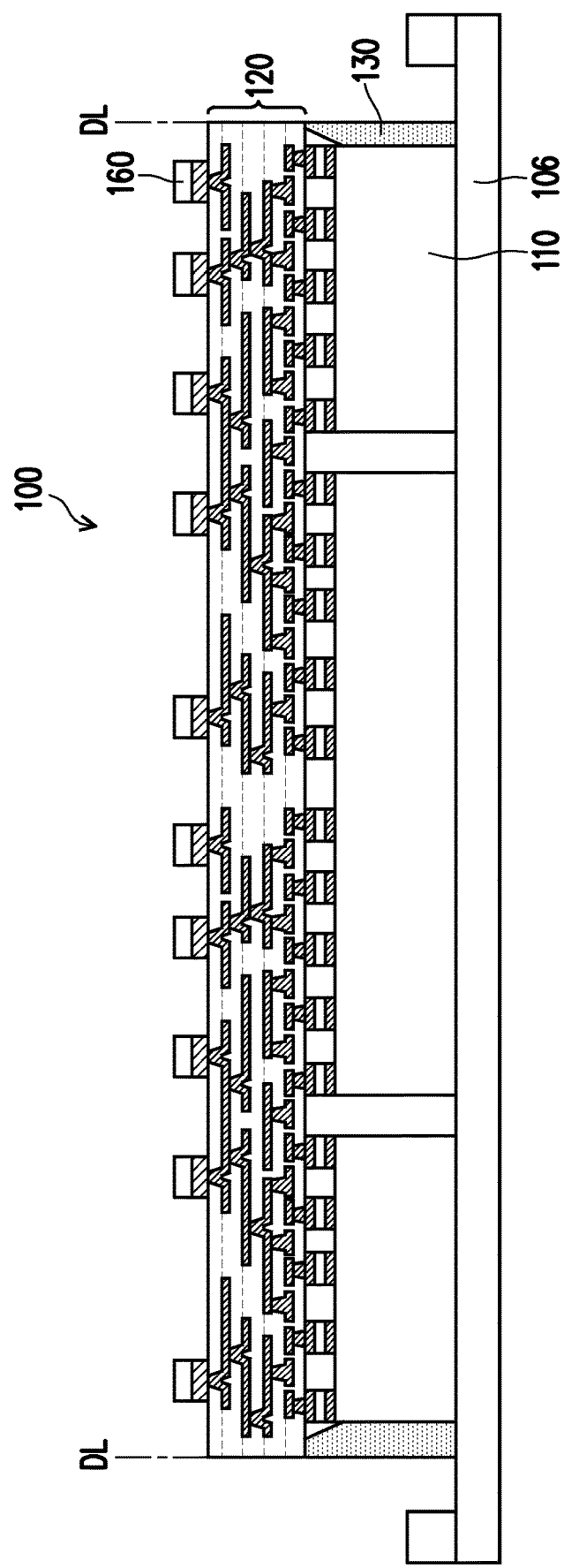

Referring to FIG. 9, the package wafer PK may then be mounted (e.g. frame mounted) onto a dicing tape 106. Following this, package wafer PK may be singulated or diced (e.g. along dicing line DL), thereby forming a plurality of package structures 100, each of which may be substantially identical to the package structure 100 shown in FIG. 10.

Figure 10:
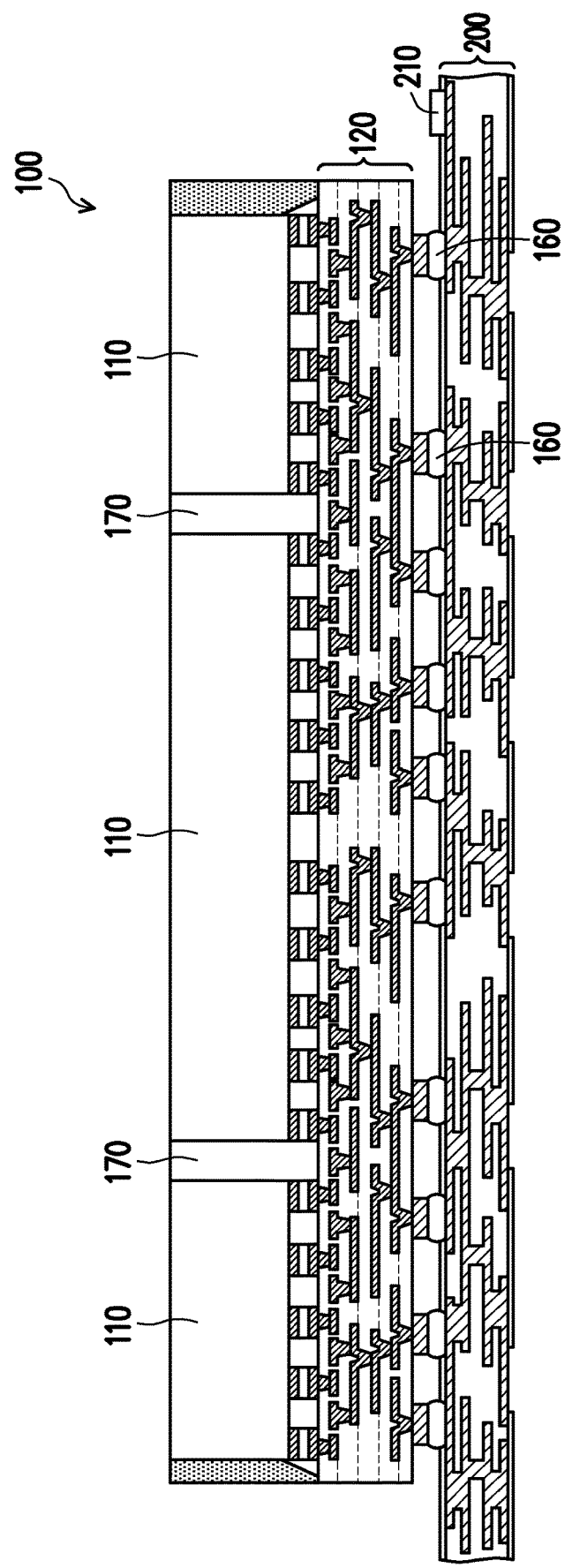

With reference now to FIG. 10, after the package structure 100 is formed, the package structure 100 may be disposed on a substrate 200 through, for example, a pick and place technique. In some embodiments, the connectors 160 are aligned to, and are put against, bond pads of the substrate 200. The connectors 160 may be reflowed to create a bond between the substrate 200 and the package structure 100. The substrate 200 may include a package substrate, such as a build-up substrate including a core therein, a laminate substrate including a plurality of laminated dielectric films, a PCB, or the like. The substrate 200 may include electrical connectors (not shown), such as solder balls, opposite the component package to allow the substrate 200 to be mounted to another device. In some embodiments, a surface mount device 210 may be directly coupled to the substrate 200. The surface mount device 210 may include one or more passive components such as a capacitor, a resistor, an inductor, the like, or a combination thereof. In an embodiment, the surface mount device 210 consists essentially of one or more passive devices and does not include an active device such as a transistor. In other embodiment, the surface mount device 210 may include an active device. The surface mount device 210 may include a plurality of conductive connectors formed of conductive materials such as solder, the like, or a combination thereof. The surface mount device 210 is electrically coupled to interconnect structure of the substrate 200 through the conductive connectors.

Figure 11:
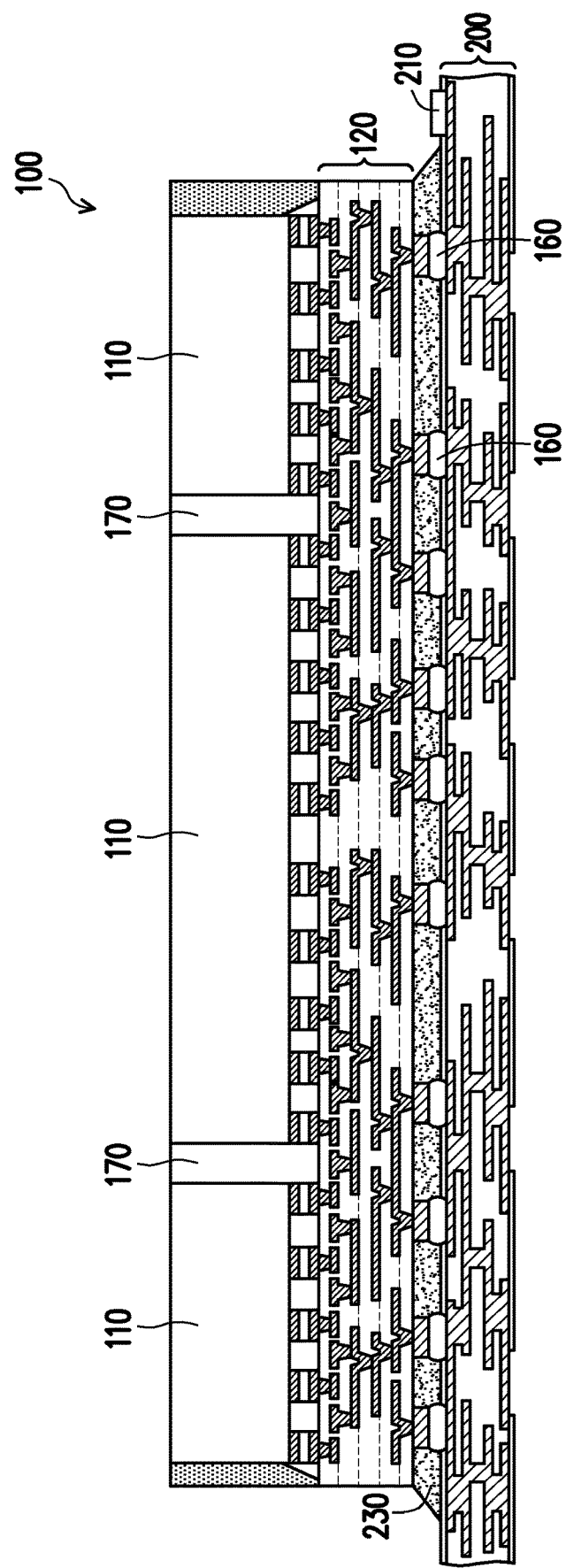

Then, as illustrated in FIG. 11, an underfill material 230 can be dispensed between the package structure 100 and the substrate 200 and surrounding the connectors 160. The underfill material 230 may be any acceptable material, such as a polymer, epoxy, molding underfill, or the like. In some embodiments, the underfill material 230 may be the same material as the filling material 170. In other embodiments, the underfill material 230 may be the different material from the filling material 170.

Figure 12:
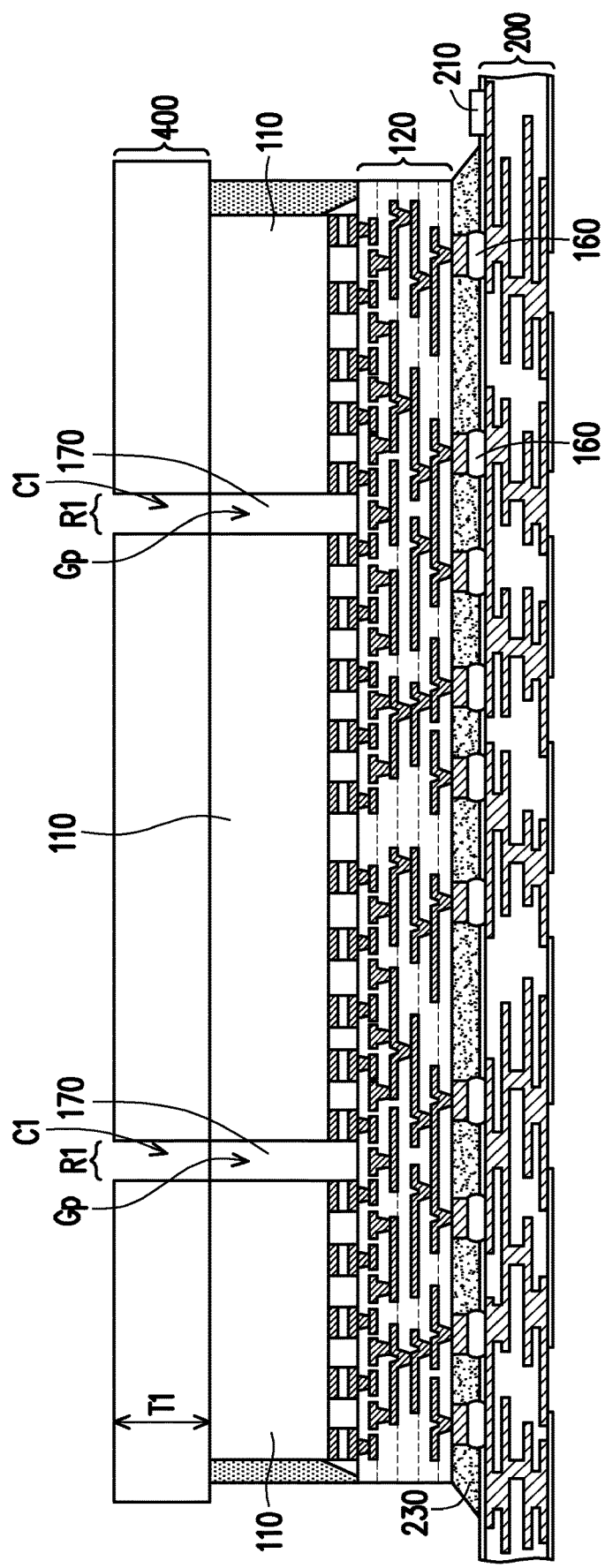

Referring to FIG. 12, a thermal spreader layer 400 may be provided over the package structure 100 to facilitate the heat dissipation of the package structure 100. In some embodiments, the thermal spreader layer 400 may include a thermal interface material (TIM). For example, the thermal spreader layer 400 includes any suitable thermally conductive material such as a polymer having a good thermal conductivity. In one embodiment, the thermal spreader layer 400 may include a metal TIM, which may be in sheet form or in gel form. The composition of the metal TIM may include indium (In), gallium (Ga), tin (Sn), silver (Ag), gold (Au), copper (Cu), bismuth (Bi), zinc (Zn), etc. The disclosure is not limited thereto. In the embodiment of the thermal spreader layer 400 being a metal TIM, both the thermal conductivity and the young's modulus of the metal TIM are higher than the regular TIM, which means the metal TIM can further improve the heat dissipation efficiency but, on the other hand, may easily induce die crack and/or delamination due to lacking of elasticity and resiliency characteristics. In some embodiments, the young's modulus of the metal TIM is substantially smaller than $10^8$ psi, and is substantially greater than 1 psi.

Accordingly, in some embodiments, the thermal spreader layer 400 has a profile that is discontinuous in thickness at a gap region R1, which is corresponding to (e.g., aligned with) the gap Gp between device dies 110. In other words, the thermal spreader layer 400 may include at least one gap region R1 (two gap regions R1 are illustrated, but not limited thereto), and a thickness of the thermal spreader layer 400 at the gap region R1 is different from a thickness T1) of the thermal spreader layer 400 at other region (e.g., a die region that is in contact with the device dies 110). In some embodiments, the thickness of the thermal spreader layer 400 at the gap region R1 is substantially thinner than the thickness T1 of the thermal spreader layer 400 at other region. Accordingly, by reducing the thickness of the thermal spreader layer 400 at the gap region R1, elasticity and resiliency of the thermal spreader layer 400 around the gap region is improved, so certain thermal stress in the semiconductor package can be released. Moreover, with such arrangement, the thermal spreader layer 400 is separated from (e.g., not in contact with) the filling material 170, which is usually lower in young's modulus, so the thermal stress between the device dies 110 can be further reduced. The young's modulus of the filling material 170 is substantially smaller than the young's modulus of the thermal spreader layer 400. For example, the young's modulus of the filling material 170 is substantially smaller than $10^6$ psi, and is substantially greater than 0.1 psi.

In addition, at least one concave C1 is defined by the discontinuous thickness profile of the thermal spreader layer 400, which provides air channel and may reduce void formation in thermal spreader layer 400. The concaves C1 are corresponding to (e.g., aligned with) the gaps Gp respectively. In some embodiments, the concaves C1 face the gaps Gp respectively and extend along a thickness direction of the thermal spreader layer 400. In some embodiments, a depth of the concave C1 is substantially greater than 10% of a maximum thickness T1 (the thickness at the die region contacting the device dies 110) of the thermal spreader layer 400, and may be substantially equal to or smaller than the maximum thickness T1 of the thermal spreader layer 400. In the embodiment shown in FIG. 12, the thickness of the thermal spreader layer 400 at the gap region R1 is substantially equal to zero. In other words, the thermal spreader layer 400 is a discontinuous layer (i.e., a segmental layer) that reveals the filling material 170 underneath. That is, the concaves C1 extend through the thermal spreader layer 400, and the concaves C1 may be filled with air. In such embodiments, the thermal spreader layer 400 may be in a sheet form and the thermal spreader sheet is cut in desired sizes to be attached to the back surface of the device die 110 and expose the filling material 170 underneath. In other embodiments, the thermal spreader layer 400 may be in a gel form (as it is shown in FIG. 13B) and the thermal spreader gel is dispensed in a desired pattern to cover the back surface of the device die 110 and expose the filling material 170. The disclosure is not limited thereto.

Figure 12A:
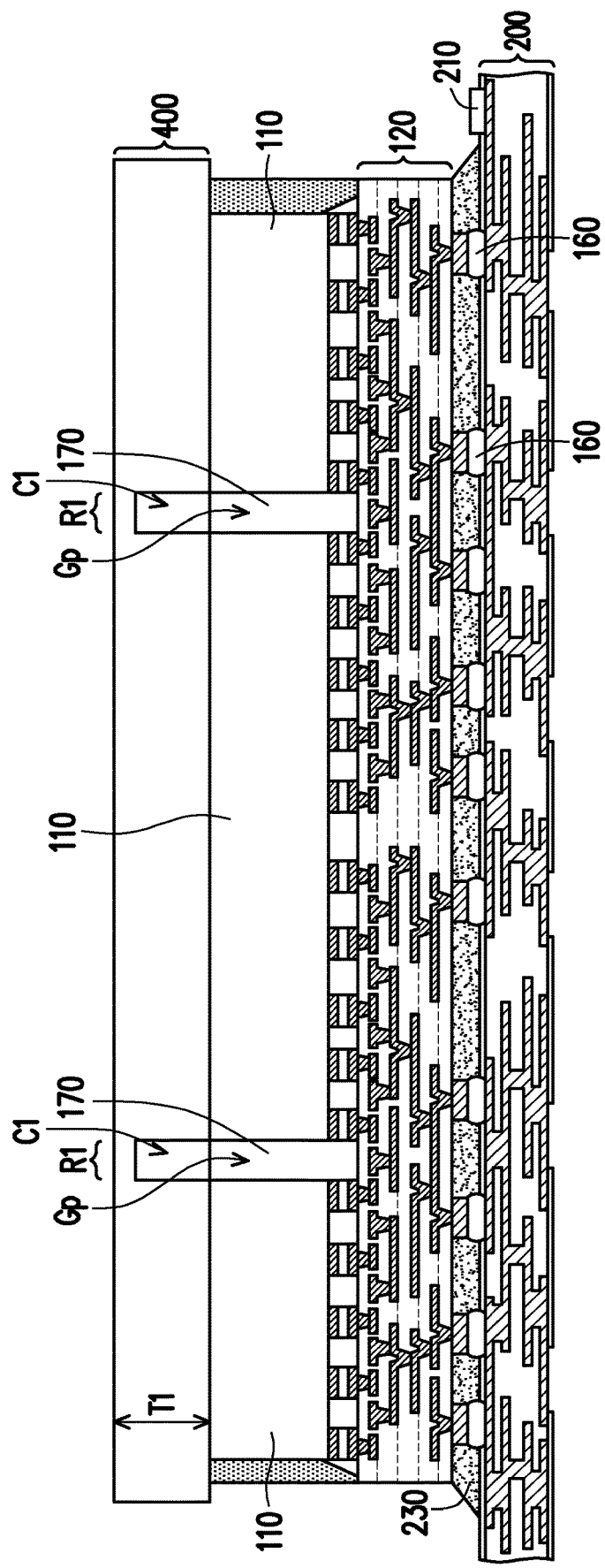
FIG. 12A illustrates a cross sectional view of an intermediate stage of a semiconductor package according to some embodiments of the present disclosure.

Referring to FIG. 12A, in some embodiments, the depth of the concave C1 may be substantially smaller than the maximum thickness T1, but greater than zero. That is, the concaves C1 extends from the gaps Gp, but does not extend all the way through the thermal spreader layer 400 as it is shown in FIG. 12A. In such embodiment, the concaves C1 may be filled with air. The thermal spreader layer 400 may be a single layer or a composite layer (e.g., multiple laminated layers of thermal spreader gel, thermal spreader sheet or combination thereof). The disclosure is not limited thereto.

Figure 13:
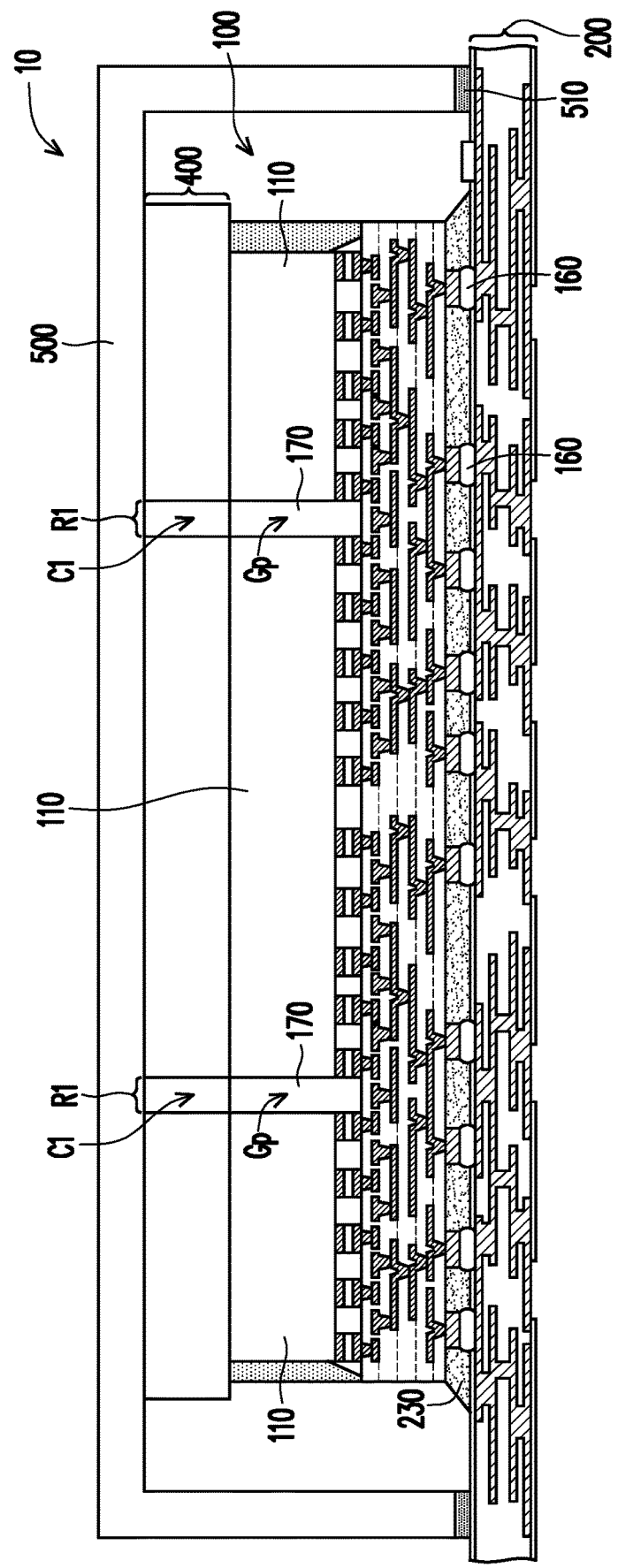

Referring to FIG. 13, in some embodiments, a lid structure 500 is then disposed over substrate 200 and covering the device dies 110 of the package structure 100. To reduce the interface thermal resistance between the device dies 110 and the lid structure 500 as low as possible and to stably bond the device dies 110 and the lid structure 500, the thermal spreader layer 400 is disposed between and in contact with the lid structure 500 and the device dies 110 to facilitate the heat dissipation of the device dies 110. To enhance the structural strength of the semiconductor package 10, a fixing element 510, such as a solder alloy, may be used to bond the substrate 200 and the lid structure 500. In other embodiments, the bond of the substrate 200 and the lid structure 500 may be accomplished by curing a solder paste or using screws. At the time, the semiconductor package 10 is substantially formed. In some embodiments, a material of the lid structure 500 may include metal, ceramic or aluminum base complex material of high thermal conduction. There is coefficient of thermal expansion (CTE) mismatch between, for example, the material typically used for the lid structure 500 (e.g., metal), and the material used for the substrate (e.g., Ajinomoto Build-up Film, ABF, glass fiber). The CTE of the lid structure 500 is usually much smaller than the CTE of the substrate 200. Such CTE mismatch between the lid structure 500 and the substrate 200 causes thermal stress on the device dies 110. Thereby, with the arrangement of the thermal spreader layer 400 having a discontinuous thickness profile, the thermal stress between the device dies 110 can be released.

Figure 13A:
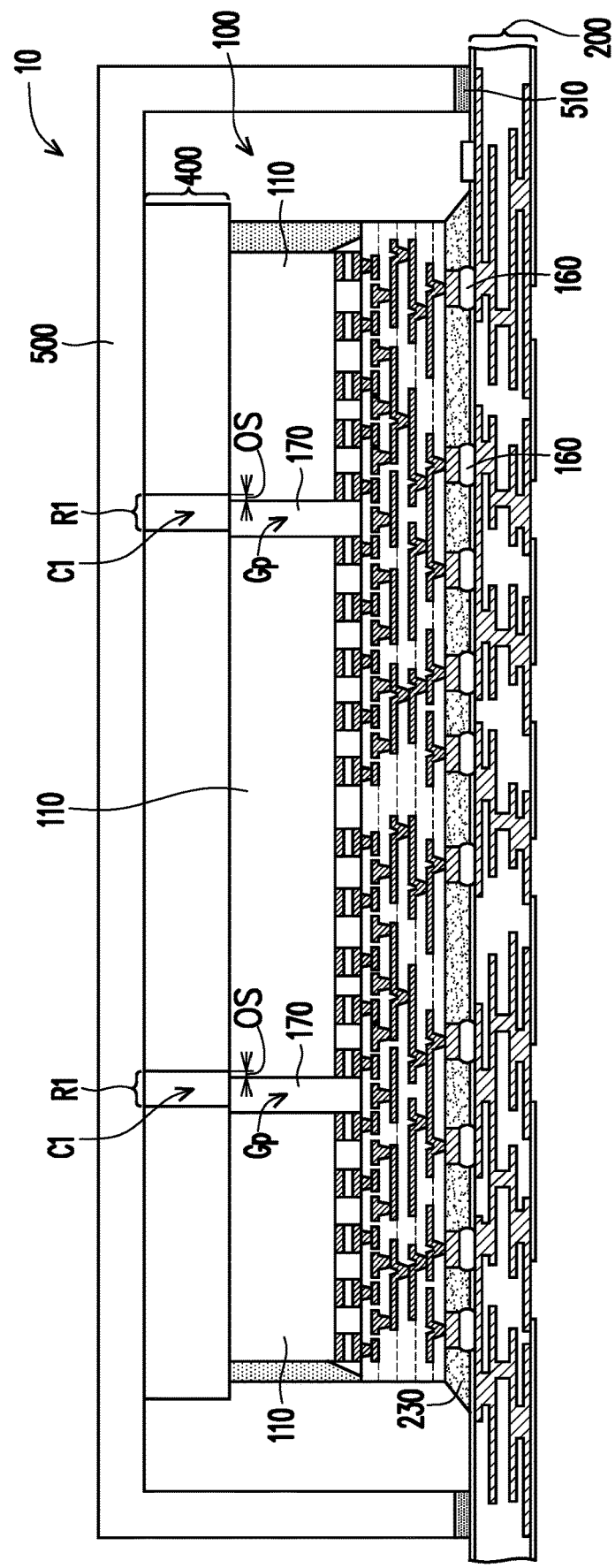
FIG. 13A and FIG. 13B illustrates cross sectional views of a semiconductor package according to some embodiments of the present disclosure.
Figure 13B:
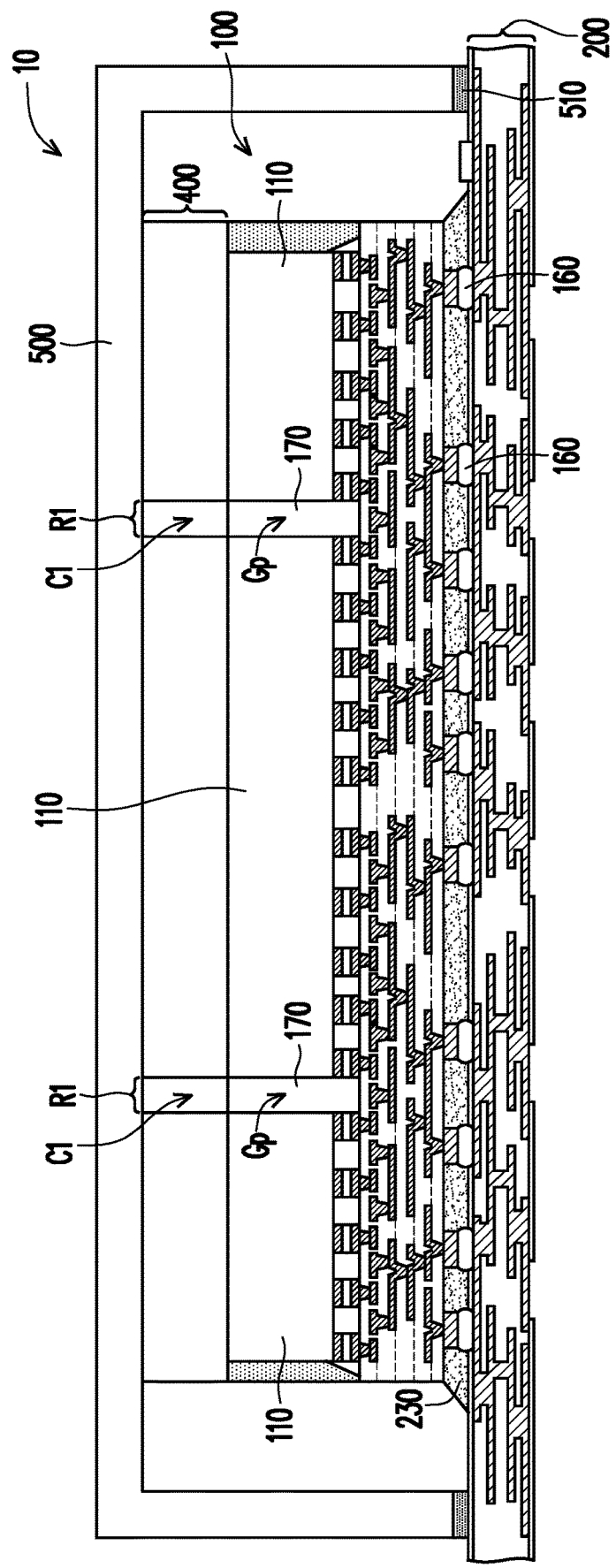

Referring to FIG. 13A, in some embodiments, the concave C1 may be corresponding to but not be completely aligned with the gaps Gp respectively according to product design or due to manufacturing tolerance. In other words, the concaves C1 may be offset from the gaps Gp by a distance OS. To be more specific, inner walls of the concaves C1 may be offset from the corresponding side surfaces of the device dies 110 by the distance OS.

Figure 14:
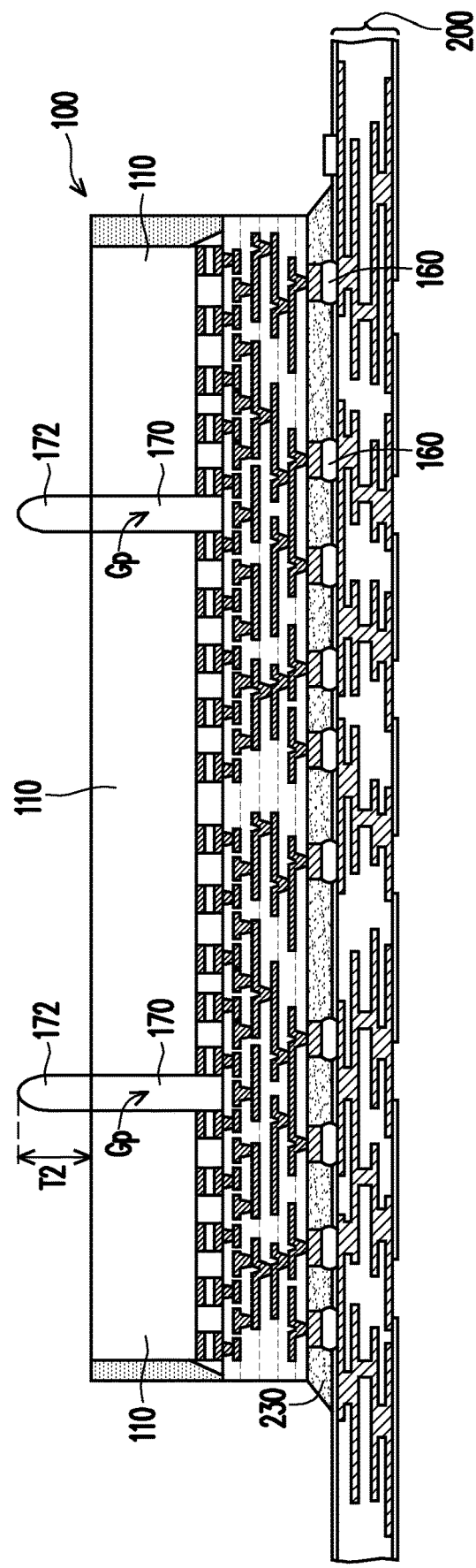
FIG. 14 to FIG. 16 illustrates a cross sectional views of intermediate stages in the manufacturing of a semiconductor package according to some embodiments of the present disclosure.
Figure 15:
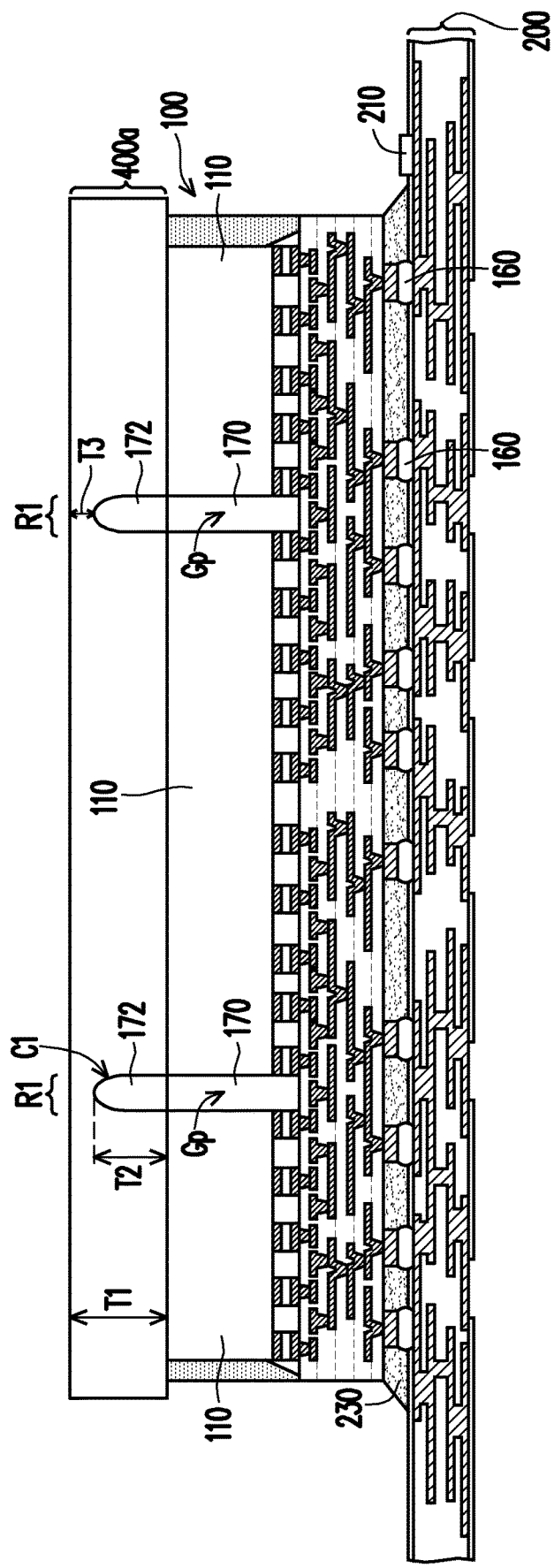
Figure 16:
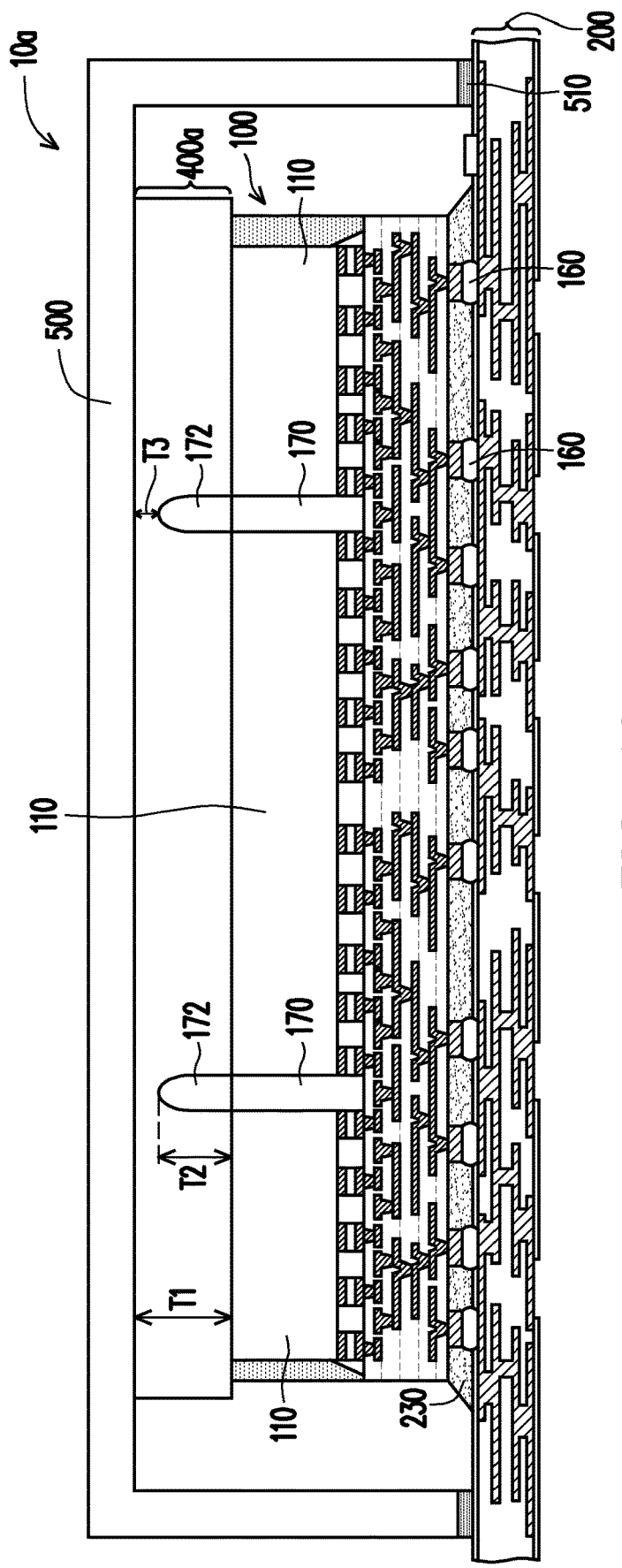

FIG. 14 to FIG. 16 illustrates a cross sectional views of intermediate stages in the manufacturing of a semiconductor package according to some embodiments of the present disclosure. It is noted that the manufacturing method and the semiconductor package shown in FIG. 14 to FIG. 16 contains many features same as or similar to the manufacturing method and the semiconductor package disclosed in the previous embodiments. For purpose of clarity and simplicity, detail description of same or similar features may be omitted, and the same or similar reference numbers denote the same or like components.

The following processes, as illustrated in FIG. 14 to FIG. 16, may be performed after the process illustrated in FIG. 11. Referring to FIG. 14, in some embodiments, after the package structure 100 is disposed on the substrate 200, at least one dam structure 172 (two dam structures 172 are illustrated, but not limited thereto) is disposed on the filling material 170. In some embodiments, the material for the dam structure 172 may be selected from various materials compatible with wafer level processing and packaging, provided it has high adhesive properties. In an embodiment, the dam structure 172 is formed of a polymer material such as polyimide (PI). For example, dispensed liquid material such as an epoxy or resin and the like may also be used. The dam structure 172 may be any acceptable material, such as a polymer, epoxy, underfill, or the like. The material of the dam structure 172 may be the same as that of the filling material 170. In other embodiments, the material of the dam structure 172 may be different from that of the filling material 170. A curing step may be performed to cure the dam structure 172. In some embodiments, the dam structure 172 is aligned and in contact with the filling material 170, and the dam structure 172 and the filling material 170 are cured at different processes respectively, so there is an interface between the dam structure 172 and the filling material 170. In some embodiments, the dam structures 172 may be considered as "stress relief element", which has a lower young's modulus (lower than thermal spreader layer 400), and is configured to release the thermal stress between the device dies 110. As illustrated in FIG. 14, the dam structure 172 has a rounded top surface (e.g., a dome), but any other suitable shape may also be applied.

Referring to FIG. 15, in some embodiments, a thermal spreader layer 400a is disposed over the package structure 100. In an embodiment, the thermal spreader layer 400a is in gel form and is dispensed on the back surfaces of the device dies 110 and encapsulates the dam structure 172. The thermal spreader layer 400a includes any suitable thermally conductive material such as a polymer having a good thermal conductivity. In one embodiment, the thermal spreader layer 400a may be a metal TIM, which may be in sheet form or in gel form. The composition of the metal TIM may include indium (In), gallium (Ga), tin (Sn), silver (Ag), gold (Au), copper (Cu), bismuth (Bi), zinc (Zn), etc. In the present embodiment, the thermal spreader layer 400a includes a metal TIM, but the disclosure is not limited thereto. The dam structure 172 may be provided by, for example, a dispenser, in-situ UV printer, etc. The maximum thickness T1 of the thermal spreader layer 400a is greater than or substantially equal to the thickness T2 of the dam structure 172. For example, the thickness T2 of the dam structure 172 is substantially greater than 10% of a maximum thickness T1 of the thermal spreader layer 400a. The upper surface of the thermal spreader layer 400a is substantially flat, and the dam structure 172 results in the corresponding concave C1 in the thermal spreader layer 400a. Accordingly, the thermal spreader layer 400a has a discontinuous thickness profile, wherein the thickness T3 of the thermal spreader layer 400a at the gap region R1 is substantially thinner than the thickness T1 of the thermal spreader layer at other region. From a resulting structure point of view, the dam structure 172 fills a space (e.g., concave C1) defined by thickness discontinuity of the thermal spreader layer 400a at the gap region R1.

With such arrangement, by reducing the thickness of the thermal spreader layer 400a at the gap region R1 via the dam structure 172, elasticity and resiliency of the thermal spreader layer 400a around the gap region R1 is improved, so thermal stress in the semiconductor package can be released. Moreover, in the present embodiment, the interface between the thermal spreader layer 400 (the structure with high young's modulus) and the dame structure 172 (the structure with lower young's modulus) is further away from the die region and separated from (e.g., not in contact with) the filling material 170, so the thermal stress around the device dies 110 can be further reduced. The young's modulus of the dam structure 172 is substantially smaller than the young's modulus of the thermal spreader layer 400a. For example, the young's modulus of the dam structure 172 is substantially smaller than 106 psi, and is substantially greater than 0.1 psi, while the young's modulus of the thermal spreader layer 400a is substantially smaller than 108 psi, and is substantially greater than 1 psi.

Referring to FIG. 16, in some embodiments, a lid structure 500 is then disposed over substrate 200 and covering the device dies 110 of the package structure 100. To reduce the interface thermal resistance between the device dies 110 and the lid structure 500 as low as possible and to stably bond the device dies 110 and the lid structure 500, the thermal spreader layer 400a is disposed between and in contact with the lid structure 500 and the device dies 110 to facilitate the heat dissipation of the device dies 110. To enhance the structural strength of the semiconductor package 10a, a fixing element 510, such as a solder alloy, may be used to bond the substrate 200 and the lid structure 500. In other embodiments, the bond of the substrate 200 and the lid structure 500 may be accomplished by curing a solder paste or using screws. At the time, the semiconductor package 10a is substantially formed. In some embodiments, a material of the lid structure 500 may include metal, ceramic or aluminum base complex material of high thermal conduction.

Figure 17:
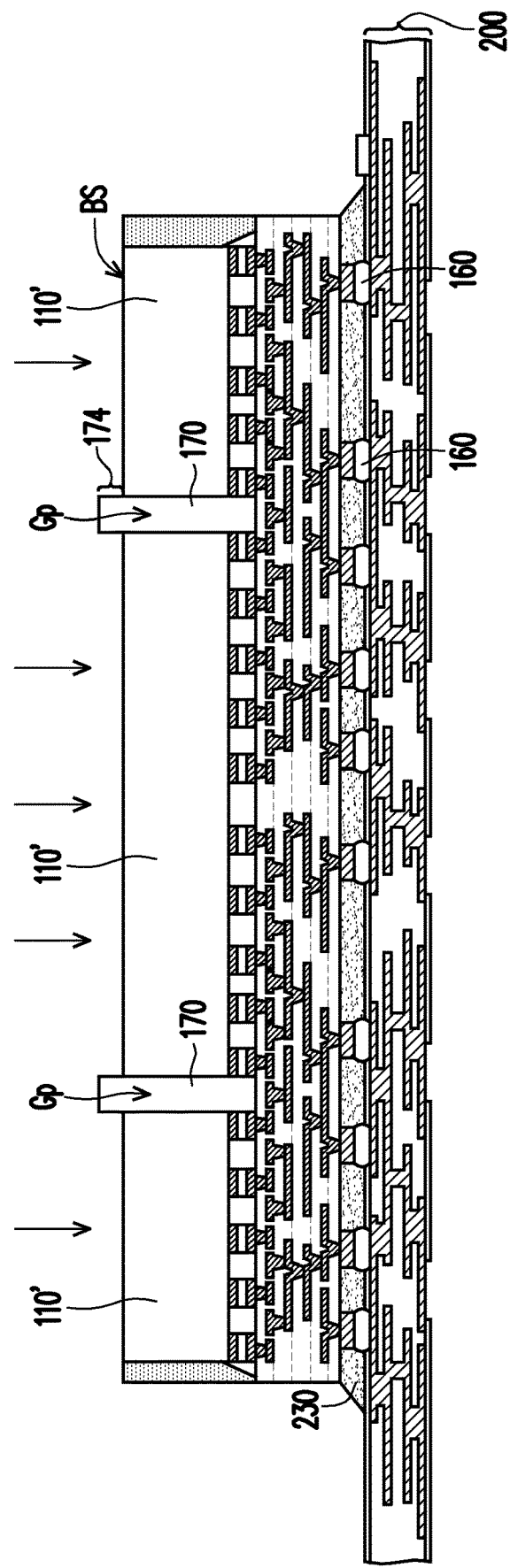
FIG. 17 to FIG. 19 illustrates a cross sectional views of intermediate stages in the manufacturing of a semiconductor package according to some embodiments of the present disclosure.
Figure 18:
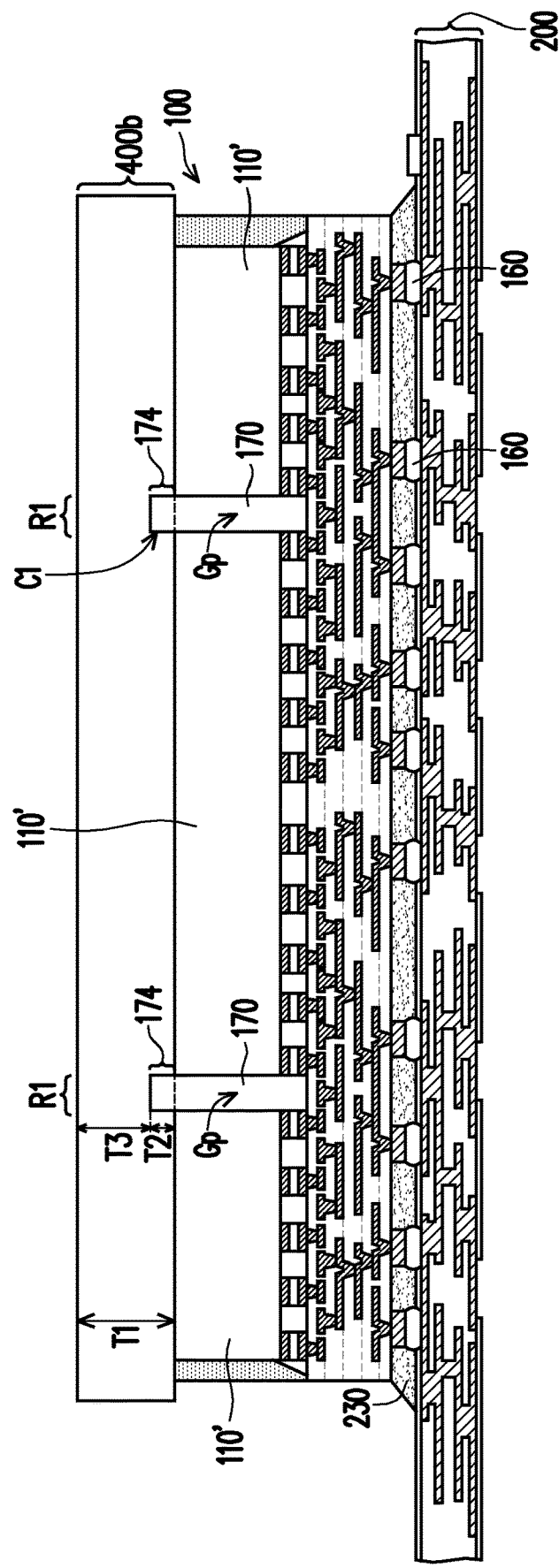
Figure 19:
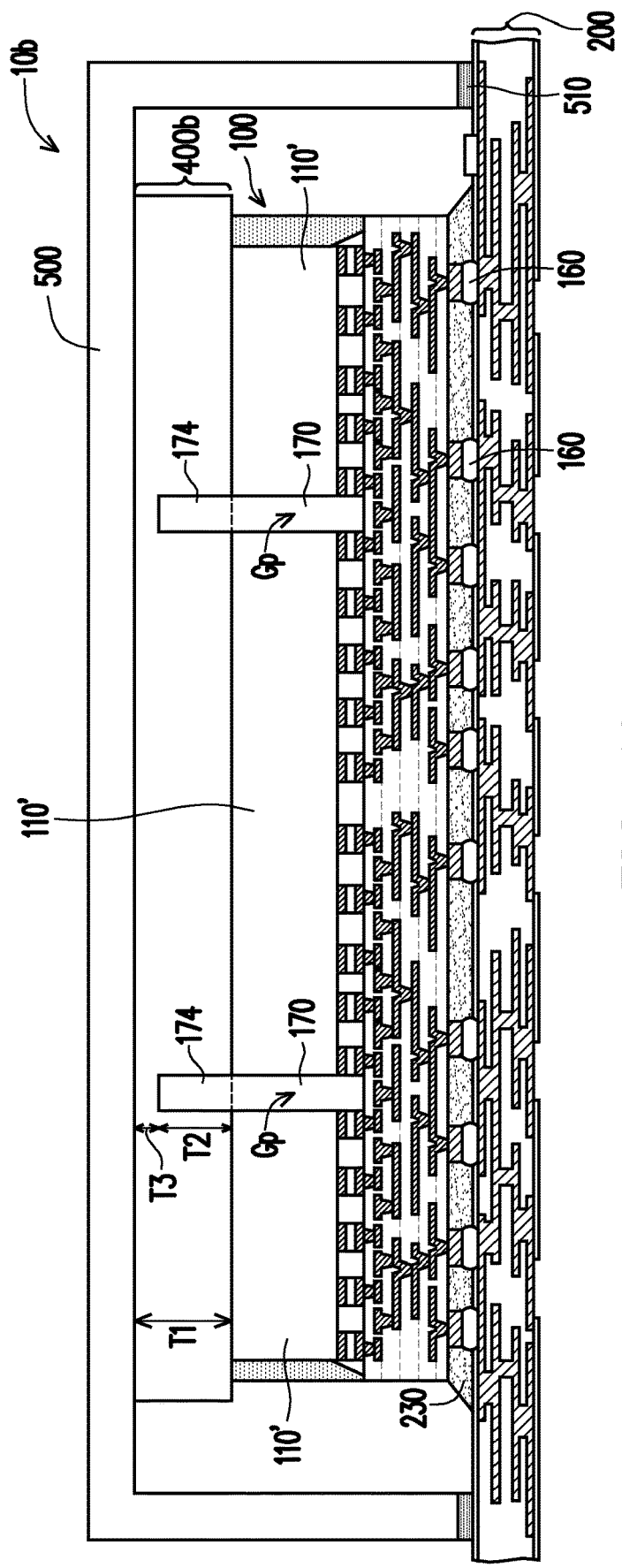

FIG. 17 to FIG. 19 illustrates a cross sectional views of intermediate stages in the manufacturing of a semiconductor package according to some embodiments of the present disclosure. It is noted that the manufacturing method and the semiconductor package shown in FIG. 17 to FIG. 19 contains many features same as or similar to the manufacturing method and the semiconductor package disclosed in the previous embodiments. For purpose of clarity and simplicity, detail description of same or similar features may be omitted, and the same or similar reference numbers denote the same or like components.

The following processes, as illustrated in FIG. 17 to FIG. 19, may be performed after the process illustrated in FIG. 11. Referring to FIG. 17, in some embodiments, after the package structure 100 is disposed on the substrate 200, a thinning process is performed to the back of the device dies 110, such that the filling material protrudes from the thinned back surfaces BS of the device dies 110'. In some embodiments, the thinning process is achieved by partially removal (e.g., thinning) of the back portions of the substrates of the device dies 110'. For example, the back portions of the substrates of the device dies 110' may be removed by an etching process, such as wet etching process, dry etching process, or a combination thereof. The etching process may a high etching selectivity ratio between the substrates and other adjacent materials (e.g., the filling material 170, etc.). After the thinning (e.g., by etching) process is performed, the back surfaces BS of the device dies 110' are lower than the top surface of the filling material 170. In other words, the filling material 170 includes a protruding portion 174 protruding from the back surfaces BS of the device dies 110'. In one embodiment, the top surface of the protruding portion 174 may be a substantially flat surface since a grinding process (the process illustrated in FIG. 5) was performed before the back portions of the device dies 110s is removed. In such embodiments, the filling material 170 including the protruding portion 174 that protrudes from the back surfaces BS of the device dies 110' is integrally formed. That is, there is no interface between the protruding portion 174 protruding from the device dies 110 and other portion of the filling material 170 filling in the gap Gp.

Referring to FIG. 18, in some embodiments, a thermal spreader layer 400b is disposed over the package structure 100. In an embodiment, the thermal spreader layer 400b is in gel form and is dispensed on the back surfaces BS of the device dies 110' and encapsulates the protruding portion 174 of the filling material 170. The thermal spreader layer 400b includes any suitable thermally conductive material such as a polymer having a good thermal conductivity. In one embodiment, the thermal spreader layer 400b may be a metal TIM, which may be in sheet form or in gel form. The composition of the metal TIM may include indium (In), gallium (Ga), tin (Sn), silver (Ag), gold (Au), copper (Cu), bismuth (Bi), zinc (Zn), etc. In the present embodiment, the thermal spreader layer 400b includes a metal TIM, but the disclosure is not limited thereto. The maximum thickness T1 of the thermal spreader layer 400b is greater than or substantially equal to the thickness T2 of the protruding portion 174. In an embodiment, the top surface of the protruding portion 174 is coplanar with the top surface of the thermal spreader layer 400b. Namely, the protruding portion 174 extends through the thermal spreader layer 400b. For example, the thickness T2 of the protruding portion 174 is substantially greater than 10% of a maximum thickness T1 of the thermal spreader layer 400b. The upper surface of the thermal spreader layer 400b is substantially flat, and the protruding portion 174 results in the corresponding concave C1 in the thermal spreader layer 400b. Accordingly, the thermal spreader layer 400b has a discontinuous thickness profile, wherein the thickness T3 of the thermal spreader layer 400b at the gap region R1 is substantially thinner than the thickness T1 of the thermal spreader layer at other region. From a resulting structure point of view, the protruding portion 174 fills a space (e.g., concave C1) defined by thickness discontinuity of the thermal spreader layer 400b at the gap region R1.

Figure 18A:
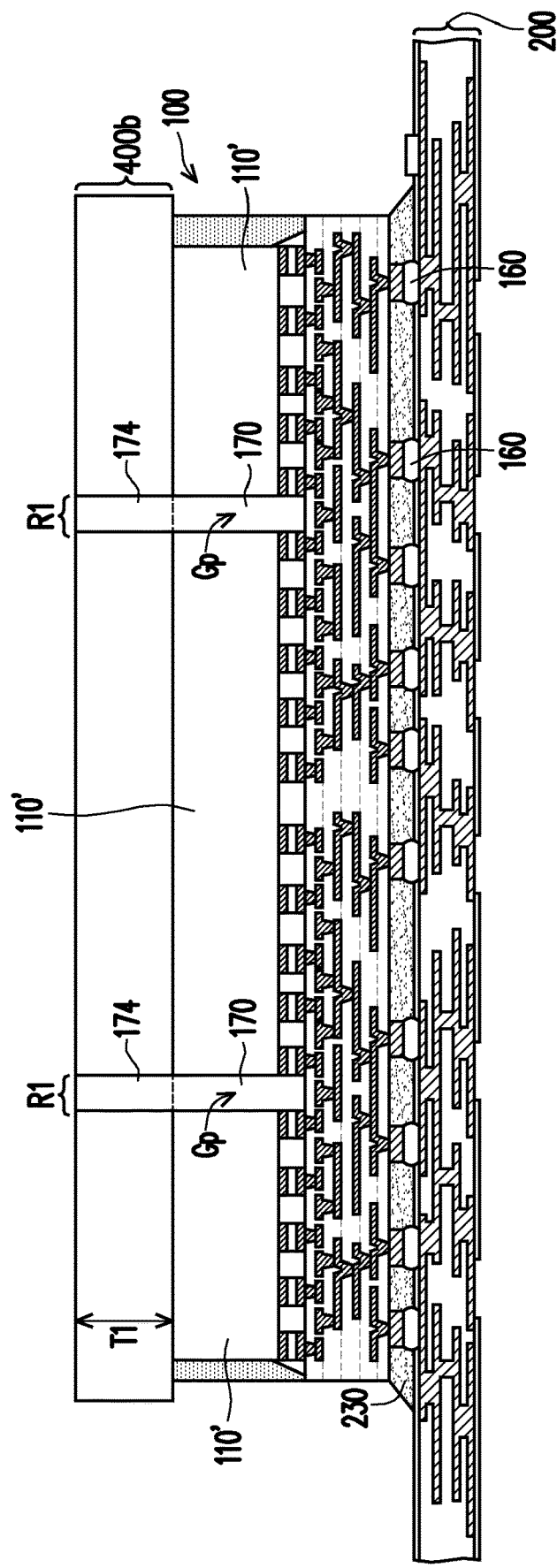

Referring to FIG. 18A, in one embodiment, the maximum thickness T1 of the thermal spreader layer 400b is substantially equal to the thickness T2 of the protruding portion 174. In such embodiment, the top surface of the protruding portion 174 is coplanar with the top surface of the thermal spreader layer 400b. That is to say, the protruding portion 174 (and the concave C1) extends through the thermal spreader layer 400b.

With such arrangement, by reducing the thickness of the thermal spreader layer 400b at the gap region R1 via the protruding portion 174 of the filling material 170, elasticity and resiliency of the thermal spreader layer 400b around the gap region R1 is improved, so thermal stress in the semiconductor package can be released. Moreover, in the present embodiment, the interface between the thermal spreader layer 400b (the structure with high young's modulus) and the protruding portion 174 (the structure with lower young's modulus) is further away from the gap region, so the thermal stress between the device dies 110' can be further reduced.

Referring to FIG. 19, in some embodiments, a lid structure 500 is then disposed over substrate 200 and covering the device dies 110' of the package structure 100. To reduce the interface thermal resistance between the device dies 110' and the lid structure 500 as low as possible and to stably bond the device dies 110' and the lid structure 500, the thermal spreader layer 400b is disposed between and in contact with the lid structure 500 and the device dies 110' to facilitate the heat dissipation of the device dies 110'. To enhance the structural strength of the semiconductor package 10b, a fixing element 510, such as a solder alloy, may be used to bond the substrate 200 and the lid structure 500. In other embodiments, the bond of the substrate 200 and the lid structure 500 may be accomplished by curing a solder paste or using screws. At the time, the semiconductor package 10b is substantially formed. In some embodiments, a material of the lid structure 500 may include metal, ceramic or aluminum base complex material of high thermal conduction.

FIG. 20 to FIG. 23 illustrates a cross sectional views of intermediate stages in the manufacturing of a semiconductor package according to some embodiments of the present disclosure. It is noted that the manufacturing method and the semiconductor package shown in FIG. 20 to FIG. 23 contains many features same as or similar to the manufacturing method and the semiconductor package disclosed in the previous embodiments. For purpose of clarity and simplicity, detail description of same or similar features may be omitted, and the same or similar reference numbers denote the same or like components.

FIG. 20 to FIG. 23 illustrates another one of the possible methods of manufacturing the package structure 100' that can be disposed on the substrate 200. In the present embodiment, the package structure 100' is an Integrated Fan-Out (InFO) package. However, the disclosure is not limited thereto. Other suitable packages and component configurations may also be applied. The package structure 100' may be in a wafer form (a reconstructed wafer) in the process. The formation of the package structure 100' may include the following steps.

Figure 20:
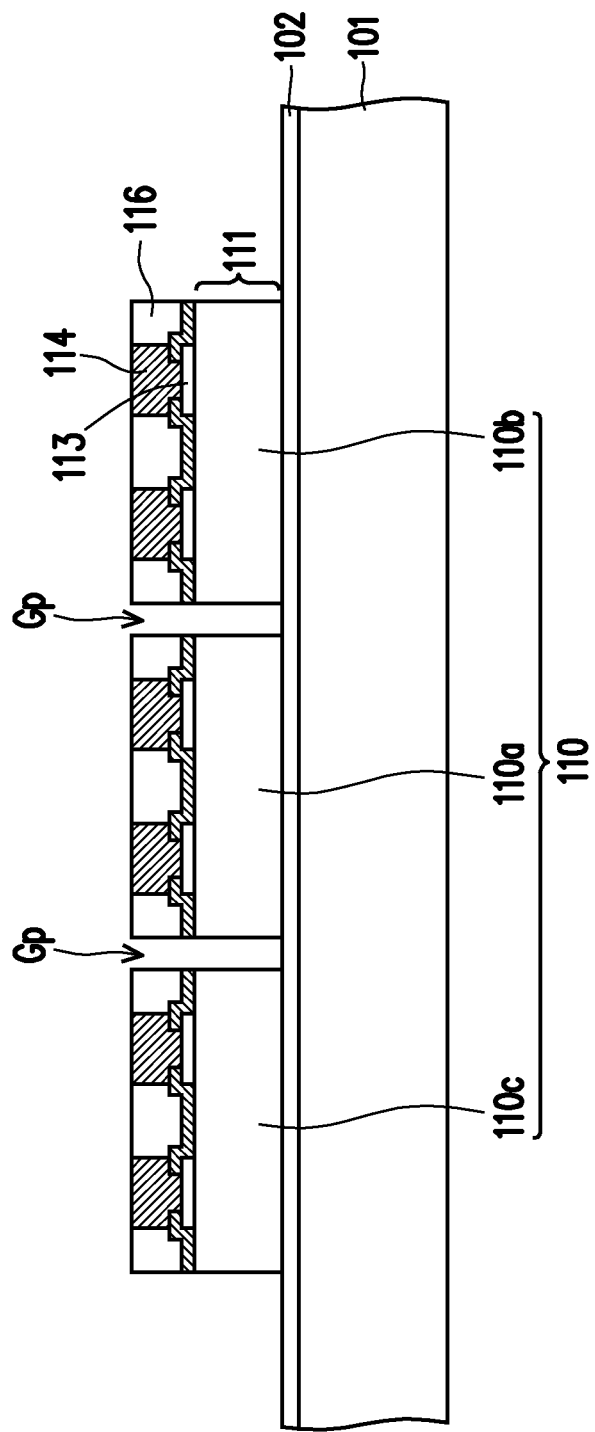
FIG. 20 to FIG. 23 illustrates a cross sectional views of intermediate stages in the manufacturing of a semiconductor package according to some embodiments of the present disclosure.

With now reference to FIG. 20, a plurality of device dies 110 may be provided over a carrier 101. In some embodiments, an adhesive layer 102 may be disposed on the carrier 101, and the carrier 101 may include, for example, silicon based materials, such as glass, ceramics or silicon oxide, or other materials, such as aluminum oxide, combinations of any of these materials, or the like. The carrier 101 is planar in order to accommodate the device dies 110 (three device dies 110a, 110b, 110c are illustrated herein, but more or less device dies may be applied). The adhesive layer 102 may be placed on the carrier 101 in order to assist in the adherence of the device dies 110. In an embodiment the adhesive layer 102 may include an ultra-violet glue, which reduces or loses its adhesive properties when exposed to ultra-violet light. However, other types of adhesives, such as pressure sensitive adhesives, radiation curable adhesives, light to heat conversion release coating (LTHC), epoxies, combinations of these, or the like, may also be used. The adhesive layer 102 may be placed onto the carrier 101 in a semi-liquid or gel form, which is readily deformable under pressure.

In some embodiments, the device dies 110 are disposed on the carrier 101 in a side-by-side manner. Accordingly, at least one gap Gp exists between any two adjacent device dies 110. Herein, two gaps Gp are illustrated, but more or less gap may be applied according to the number of the device dies 110. In an embodiment, the device dies 110a, 110b, 110c are electrically connected through, e.g., a redistribution structure 120 (not illustrated in FIG. 20 but illustrated and discussed below with respect to FIG. 22) and may be utilized together in order to provide a desired functionality to an end user. In some embodiment, the device dies 110a, 110b, 110c may be attached to the carrier 101 by a die attach film, for example, although any suitable method of attachment may alternatively be utilized. With such arrangement, a plurality of package structures can be formed concurrently for batch production. For the sake of brevity and clarity, the following manufacturing processes are described regarding one of the package structure.

In some embodiments, the structures of the device dies 110 are the same or at least similar to the device dies 110 in previous embodiments. For example, each of the device dies 110 may include a substrate 111, a plurality of active devices (not shown), a plurality of contact pads 113, at least one dielectric layer 116, and a plurality of conductive vias 114. The conductive vias 114 (such as copper vias) may be formed on an active surface (e.g. the top surface) of the device dies 110 and electrically coupled to the contact pads 113 on the substrate 111. The substrate 111 may include bulk silicon, doped or undoped, or an active layer of a silicon-on-insulator (SOI) substrate. Generally, an SOI substrate includes a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. The active devices includes a wide variety of active devices and passive devices such as capacitors, resistors, inductors and the like that may be used to generate the desired structural and functional requirements of the design for the device dies 110. The active devices may be formed using any suitable methods either within or else on the substrate 111.

In some embodiments, the dielectric layer 116 may be formed on the active surface of the device die 110, and may cover the top surfaces of the conductive vias 114. In other embodiments, the top surface of the dielectric layer 116 may be substantially level with the top surfaces of the conductive vias 114. Alternatively, the dielectric layer 116 may be omitted, and the conductive vias 114 protrude from the active surface of the device die 110. The dielectric layer 116 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The dielectric layer 116 may be formed through a process such as chemical vapor deposition (CVD), although any suitable process may be utilized.

In some embodiments, at least one of the device dies (e.g., first device die 110a) may include one or more logic dies (e.g., central processing unit, graphics processing unit, system-on-a-chip, field-programmable gate array (FPGA), microcontroller, or the like), memory dies (e.g., dynamic random access memory (DRAM) die, static random access memory (SRAM) die, or the like), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. In some embodiments, at least one of the device dies (e.g., the second device die 110b and the third device die 110c) includes one or more memory dies, such as a stack of memory dies (e.g., DRAM dies, SRAM dies, High-Bandwidth Memory (HBM) dies, Hybrid Memory Cubes (HMC) dies, or the like). In the embodiments of memory dies stack, each of the device dies (e.g., the second device die 110b and the third device die 110c) can include both memory dies and a memory controller, such as, for example, a stack of four or eight memory dies with a memory controller. Also, in some embodiments, the device dies 110, 110b, 110c may be different sizes (e.g., different heights and/or surface areas), and in other embodiments, the device dies 110, 110b, 110c may be the same size (e.g., same heights and/or surface areas).

Figure 21:
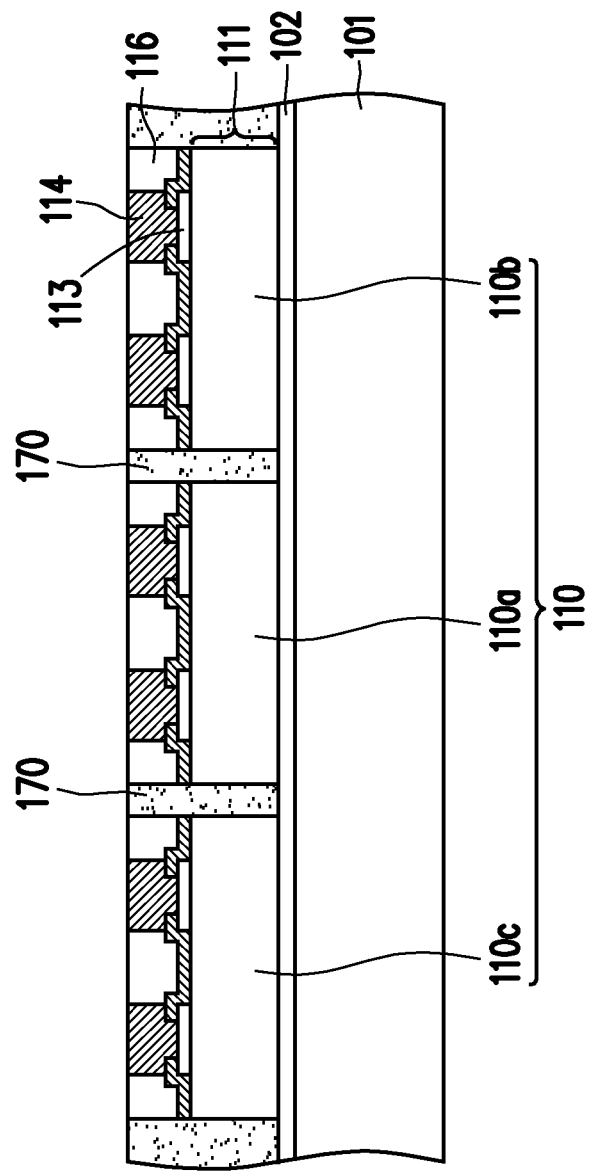

Referring to FIG. 21, in some embodiments, a filling material 170 is provided to at least fill the gaps Gp between the device die 110. In an embodiment, the filling material 170 includes an underfill material, which is dispensed into the gaps Gp between the device dies 110. The underfill material 120 may extend up along sidewall of the device dies 110. The underfill material 120 may be any acceptable material, such as a polymer, epoxy, molding underfill, or the like. In such embodiment, the filling material 170 fills the gaps Gp between the device dies 110, and may not cover (encapsulate) the outermost side surfaces of the device die 110.

In the present embodiments, the filling material 170 includes an encapsulating material, which is formed over the carrier 101 to encapsulate the device dies 110. The filling material 170 may include any suitable molding compound resin such as polyimide, PPS, PEEK, PES, a heat resistant crystal resin, combinations of these, or the like, and may be applied by compression molding, transfer molding, or the like. A curing step is performed to cure the encapsulating material, such as a thermal curing, an Ultra-Violet (UV) curing, or the like. In some embodiments, the device dies 110 are buried in the filling material 170, and after the curing of the filling material 170, a planarization step, such as a mechanical grinding or CMP process, may be performed to remove excess portions of the filling material 170, which excess portions are over top surfaces of device dies 110. Accordingly, top surfaces of device dies 110 are revealed, and are level with a top surface of the filling material 170. In such embodiment, the filling material 170 not only fills the gaps Gp between the device dies 110, but also can encapsulate each of the side surfaces (including the outermost side surfaces) of the device die 110 as it is shown in FIG. 21.

Figure 22:
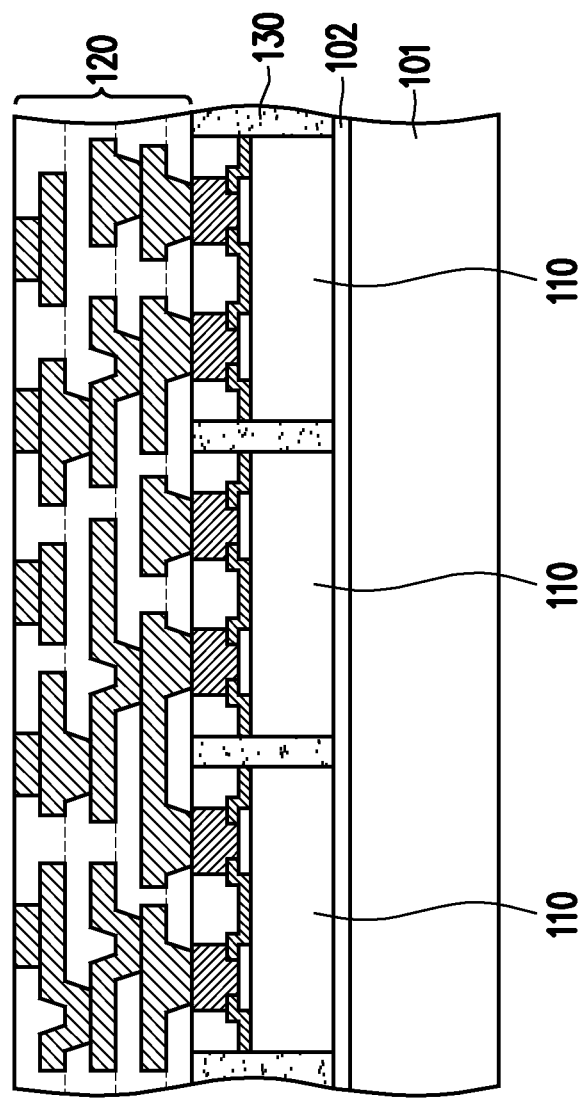

With reference now to FIG. 22, a redistribution structure 120 is formed over the device dies 110 and the filling material 170. The redistribution structure 120 is electrically connected to the device dies 110. The redistribution structure 120 may be formed by, for example, depositing conductive layers, patterning the conductive layers to form redistribution circuits, partially covering the redistribution circuits and filling the gaps between the redistribution circuits with dielectric layers, etc. The material of the redistribution circuits may include a metal or a metal alloy including aluminum, copper, tungsten, and/or alloys thereof. The dielectric layers may be formed of dielectric materials such as oxides, nitrides, carbides, carbon nitrides, combinations thereof, and/or multi-layers thereof. The redistribution circuits are formed in the dielectric layers and electrically connected to the device dies 110.

Figure 23:
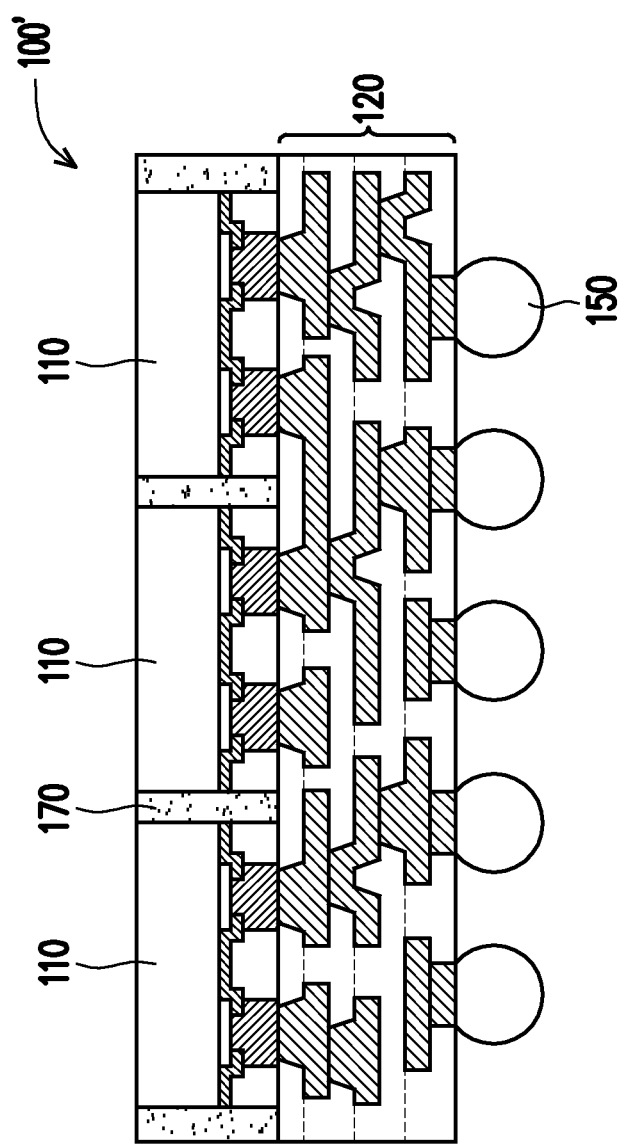

With reference now to FIG. 23, a plurality of conductive bumps 150 are disposed on the redistribution structure 120. In some embodiments, an Under Bump Metallurgy (UBM) layer may be formed on the redistribution structure 120 by sputtering, evaporation, or electroless plating, etc., and the conductive bumps 150 may be disposed on the UBM layer. In some embodiments, at least one Integrated Passive Device (IPD) may also be disposed on the redistribution structure 120 in accordance with some exemplary embodiments. The formation of the conductive bumps 150 may include placing solder balls on the redistribution structure 120, and then reflowing the solder balls. In alternative embodiments, the formation of the conductive bumps 150 may include performing a plating process to form solder regions on the UBM layer (or on the first redistribution structure 120), and then reflowing the solder regions. The IPD may be fabricated using standard wafer fabrication technologies such as thin film and photolithography processing, and may be mounted on the redistribution structure 120 through, for example, flip-chip bonding or wire bonding, etc. Throughout the description, the resultant structure including the redistribution structure 120, the device dies 110, the filling material 170, and the conductive bumps 150 as shown in FIG. 4 is referred to as the package wafer, which may have a wafer form in the process.

Then, a demounting step is performed to remove the carrier 101 from the package wafer. In some embodiments, the carrier 101 is detached from the package wafer by causing the adhesive layer 102 to lose or reduce adhesion. The adhesive layer 102 is then removed along with the carrier 101. For example, the adhesive layer 102 may be exposed to UV light, so that the adhesive layer 102 loses or reduces adhesion, and hence the carrier 101 and the adhesive layer 102 can be removed from the package wafer. Then, the package wafer may be singulated or diced (e.g. along dicing line), thereby forming a plurality of package structures 100', each of which may be substantially identical to the package structure 100' shown in FIG. 23. One of the package structures 100' may then be disposed on the substrate 200.

FIG. 24 to FIG. 31 illustrate a cross sectional views of intermediate stages in the manufacturing of a semiconductor package according to some embodiments of the present disclosure. It is noted that the manufacturing method and the semiconductor package shown in FIG. 24 to FIG. 31 contains many features same as or similar to the manufacturing method and the semiconductor package disclosed in the previous embodiments. For purpose of clarity and simplicity, detail description of same or similar features may be omitted, and the same or similar reference numbers denote the same or like components.

FIG. 24 to FIG. 31 illustrate another one of the possible methods of manufacturing the semiconductor package 10c. In the present embodiment, the semiconductor package 10c is a CoWoS® (Chip on Wafer on Substrate) package. However, the disclosure is not limited thereto. Other suitable packages and component configurations may also be applied. The package structure 100' may be in a wafer form (a reconstructed wafer) in the process. The formation of the package structure 100' may include the following steps.

Figure 24:
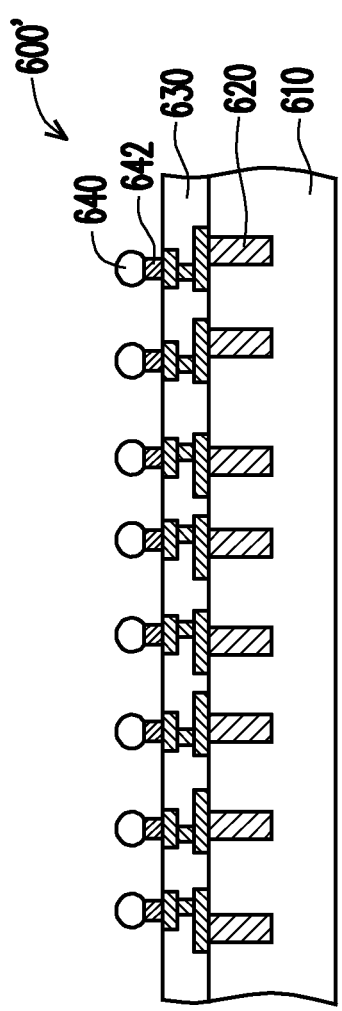
FIG. 24 to FIG. 31 illustrates a cross sectional views of intermediate stages in the manufacturing of a semiconductor package according to some embodiments of the present disclosure.

Referring to FIG. 24, in some embodiments, a redistribution structure 600' is provided. In the present embodiment, the redistribution structure 600' is an interposer, but the disclosure is not limited thereto. In such embodiment, the interposer 600' may be in a wafer form, and the substrate 610 of the interposer 600' may include a bulk semiconductor substrate, SOI substrate, multi-layered semiconductor substrate, or the like. The semiconductor material of the substrate 610 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 610 may be doped or undoped. Devices, such as transistors, capacitors, resistors, diodes, and the like, may be formed in and/or on an active surface of the substrate 610.

In accordance with some embodiments of the disclosure, a plurality of through-vias 620 are formed to extend from the active surface of substrate 610 into substrate 610. The through vias 620 are also sometimes referred to as through-substrate vias or through-silicon vias when substrate 610 is a silicon substrate. The through vias 620 may be formed by forming recesses in the substrate 610 by, for example, etching, milling, laser techniques, a combination thereof, and/or the like. A thin dielectric material may be formed in the recesses, such as by using an oxidation technique. A thin barrier layer may be conformally deposited over the front side of the substrate 610 and in the openings, such as by CVD, ALD, PVD, thermal oxidation, a combination thereof, and/or the like. The barrier layer may comprise a nitride or an oxynitride, such as titanium nitride, titanium oxynitride, tantalum nitride, tantalum oxynitride, tungsten nitride, a combination thereof, and/or the like. A conductive material may be deposited over the thin barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from the front side of the substrate 610 by, for example, CMP. Thus, the through vias 620 may include a conductive material and a thin barrier layer between the conductive material and the substrate 610.

In accordance with some embodiments of the disclosure, a redistribution structure 630 is formed over the active surface of the substrate 610, and is used to electrically connect the integrated circuit devices, if any, and/or through vias 620 together and/or to external devices. The redistribution structure 630 may include one or more dielectric layer(s) and respective metallization pattern(s) in the dielectric layer(s). The metallization patterns may comprise vias and/or traces to interconnect any devices and/or through vias 620 together and/or to an external device. The metallization patterns are sometimes referred to as Redistribution Lines (RDL). The dielectric layers may comprise silicon oxide, silicon nitride, silicon carbide, silicon oxynitride, low-K dielectric material, such as PSG, BPSG, FSG, SiOxCy, Spin-On-Glass, Spin-On-Polymers, silicon carbon material, compounds thereof, composites thereof, combinations thereof, or the like. The dielectric layers may be deposited by any suitable method known in the art, such as spinning, CVD, PECVD, HDP-CVD, or the like. A metallization pattern may be formed in the dielectric layer, for example, by using photolithography techniques to deposit and pattern a photoresist material on the dielectric layer to expose portions of the dielectric layer that are to become the metallization pattern. An etch process, such as an anisotropic dry etch process, may be used to create recesses and/or openings in the dielectric layer corresponding to the exposed portions of the dielectric layer. The recesses and/or openings may be lined with a diffusion barrier layer and filled with a conductive material. The diffusion barrier layer may comprise one or more layers of TaN, Ta, TiN, Ti, CoW, or the like, deposited by ALD, or the like, and the conductive material may comprise copper, aluminum, tungsten, silver, and combinations thereof, or the like, deposited by CVD, PVC, or the like. Any excessive diffusion barrier layer and/or conductive material on the dielectric layer may be removed, such as by using a CMP.

In some embodiments, a plurality of electrical connectors 640, 642 are formed at the top surface of the redistribution structure 630 on conductive pads. In some embodiments, the conductive pads may include UBMs. As an example to form the pads, a seed layer (not shown) is formed at least in the opening in the dielectric layer of the redistribution structure 630. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads. In the embodiment, where the pads are formed differently, more photo resist and patterning steps may be utilized.

In some embodiments, the electrical connectors 640, 642 include a metal pillar 642 with a metal cap layer 640, which may be a solder cap, over the metal pillar 642. The electrical connectors including the pillar 642 and the cap layer 640 are sometimes referred to as micro bumps. In some embodiments, the metal pillars 642 include a conductive material such as copper, aluminum, gold, nickel, palladium, the like, or a combination thereof and may be formed by sputtering, printing, electro plating, electroless plating, CVD, or the like. The metal pillars 642 may be solder free and have substantially vertical sidewalls. In some embodiments, a metal cap layer 640 is formed on the top of the metal pillar 642. The metal cap layer 640 may include nickel, tin, tin-lead, gold, copper, silver, palladium, indium, nickel-palladium-gold, nickel-gold, the like, or a combination thereof and may be formed by a plating process.

In another embodiment, the electrical connectors 640, 642 do not include the metal pillars and are solder balls and/or bumps, such as controlled collapse chip connection (C4), electroless nickel immersion Gold (ENIG), electroless nickel electroless palladium immersion gold technique (ENEPIG) formed bumps, or the like. In this embodiment, the electrical connectors 640, 642 may include a conductive material such as solder, copper, aluminum, gold, nickel, silver, palladium, tin, the like, or a combination thereof. In this embodiment, the electrical connectors 640, 642 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes.

Figure 25:
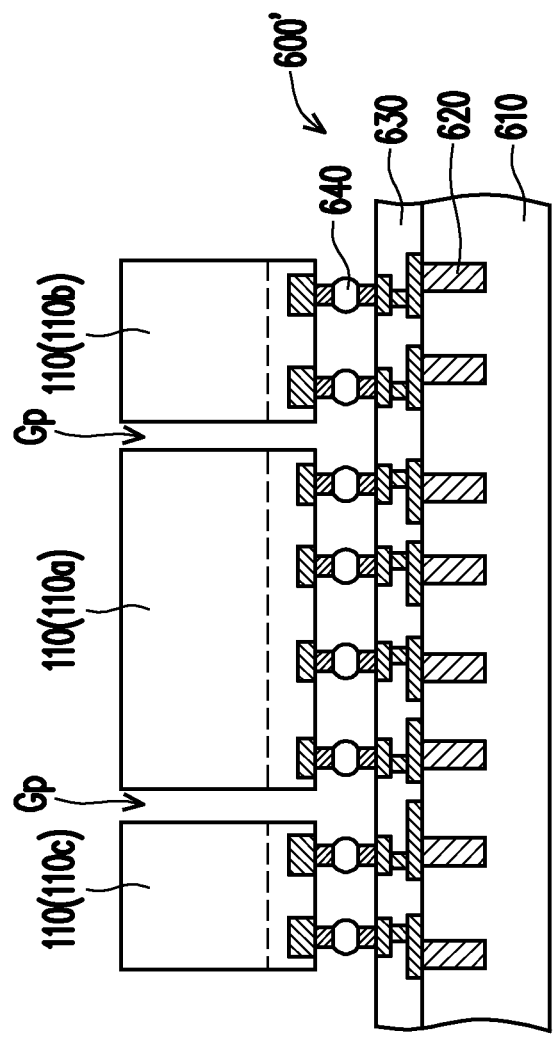

With now reference to FIG. 25, in some embodiments, a plurality of device dies 110 are attached to the interposer 600', for example, through flip-chip bonding. The device dies 110 may be placed on the electrical connectors 640, 642 using, for example, a pick-and-place tool. The bonding between the device dies 110 and the interposer 600' may be a solder bonding or a direct metal-to-metal (such as a copper-to-copper or tin-to-tin) bonding. In an embodiment, the device dies 110 are bonded to the interposer 600' by a reflow process. In some embodiments, the device dies 110 may be formed through similar processing as described above in the previous embodiments. At least one of the device die (e.g., device die 110a) may include one or more logic dies (e.g., central processing unit, graphics processing unit, system-on-a-chip, field-programmable gate array (FPGA), microcontroller, or the like), memory dies (e.g., dynamic random access memory (DRAM) die, static random access memory (SRAM) die, or the like), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. In some embodiments, at least one of the device die (e.g., device die 110b, 110c) may include one or more memory dies, such as a stack of memory dies (e.g., DRAM dies, SRAM dies, High-Bandwidth Memory (HBM) dies, Hybrid Memory Cubes (HMC) dies, or the like). In the stack of memory dies embodiments, the device die can include both memory dies and a memory controller, such as, for example, a stack of four or eight memory dies with a memory controller. Also, in some embodiments, the device dies 110a, 110b, 110c may be different sizes (e.g., different heights and/or surface areas), and in other embodiments, the device dies 110a, 110b, 110c may be the same size (e.g., same heights and/or surface areas).

Figure 26:
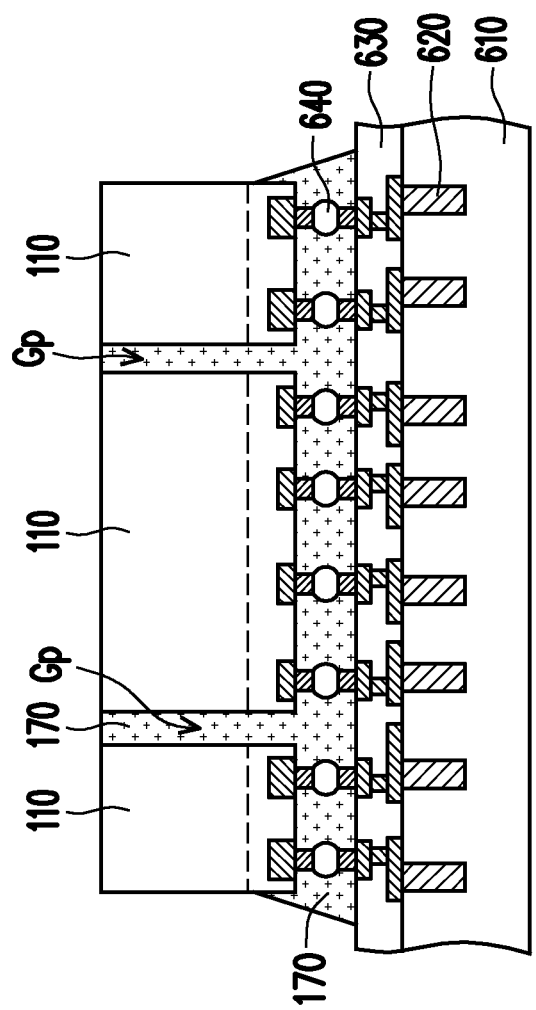

As illustrated in FIG. 26, a filling material 170 is provided to at least fill the gaps Gp between the device dies 110. In an embodiment, the filling material 170 is dispensed into the gaps Gp between the device dies 110 and the space between the device dies 110 and the interposer 600'. Then, a thermal process is performed to set (cure) the filling material 170. In some embodiments, the filling material 170 may extend up along sidewall of the device dies 110. The filling material 170 may be any acceptable material, such as a polymer, epoxy, molding underfill, or the like. In the present embodiment, the filling material includes underfill material, but the disclosure is not limited thereto. The filling material 170 may be formed by a capillary flow process after the device dies 110 are attached, or may be formed by a suitable deposition method before the device dies 110 are attached. In such embodiment, the filling material 170 fills the gaps Gp between the device dies 110, and may partially cover or not cover the outermost side surfaces of the device die 110 as it is shown in FIG. 26.

In some embodiments, an encapsulating material may be optionally provided over the interposer 600' to encapsulate the device dies 110 in accordance with some embodiments. Then, a thermal process is performed to set the encapsulating material. The encapsulating material may include a molding compound, an epoxy, or a resin, etc. In some embodiments, the encapsulating material may cover the back surfaces of the device dies 110. Then, a thinning process, which includes a grinding process, may be performed to thin the filling material 170, the encapsulating material (if any) until the back surfaces of the device dies 110 are revealed. The resulting structure is shown in FIG. 26. Due to the thinning process, the back surfaces of the device dies 110 are substantially level with the upper surfaces of the filling material 170, and may be substantially level with the upper surface of the encapsulating material (if any) as shown in FIG. 26.

Figure 27:
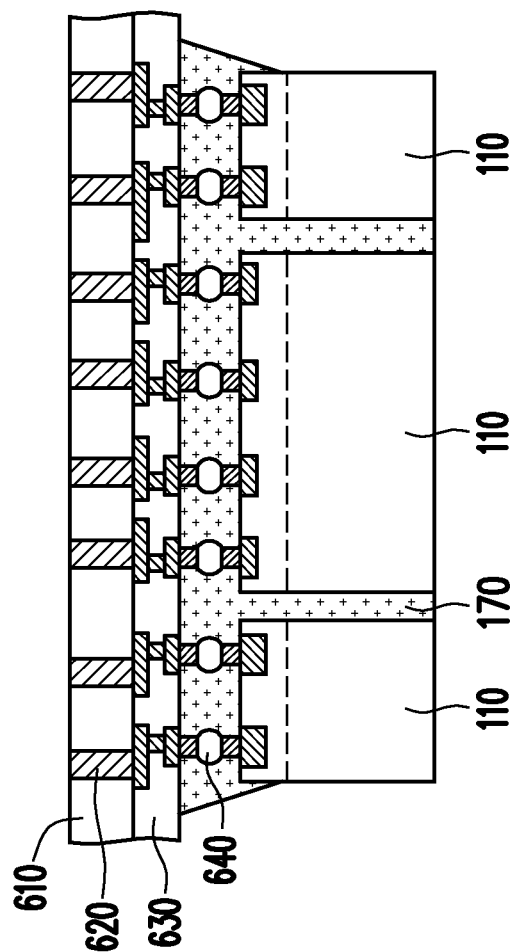

Referring to FIG. 27, in some embodiments, a thinning process is performed on the back side of the substrate 610 to thin the substrate 610 until the through vias 620 are exposed. The thinning process may include an etching process, a grinding process, the like, or a combination thereof.

Figure 28:
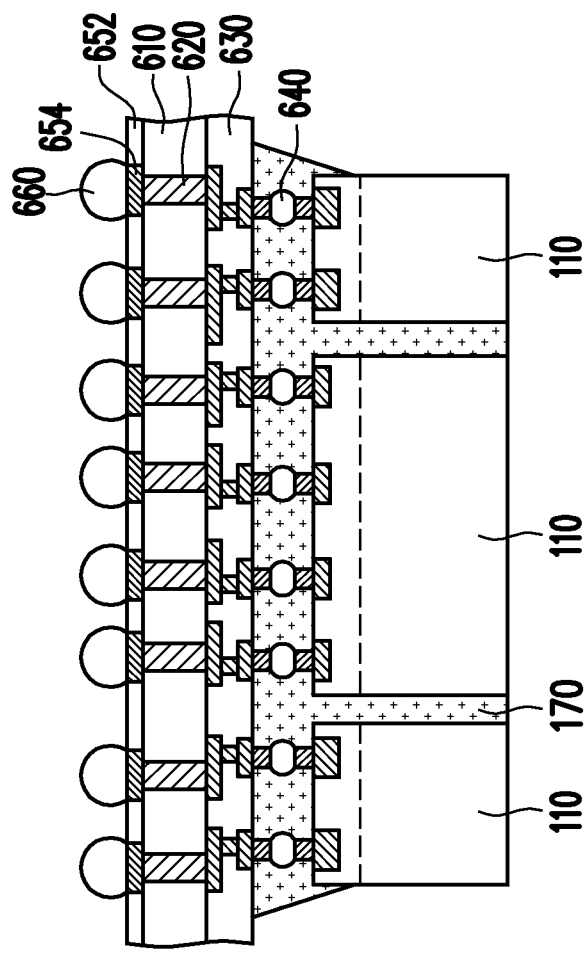

Referring to FIG. 28, then, a redistribution structure 650 is formed on the back surface of the substrate 610, and is used to electrically connect the through vias 620 together and/or to external devices. The redistribution structure includes one or more dielectric layers 652 and metallization patterns 654 in the one or more dielectric layers 652. The metallization patterns 654 may include vias and/or traces to interconnect through vias 620 together and/or to an external device. The metallization patterns 654 are sometimes referred to as Redistribution Lines (RDLs). The dielectric layers 652 may include silicon oxide, silicon nitride, silicon carbide, silicon oxynitride, low-K dielectric material, such as PSG, BPSG, FSG, SiOxCy, Spin-On-Glass, Spin-On-Polymers, silicon carbon material, compounds thereof, composites thereof, combinations thereof, or the like. The dielectric layers 652 may be deposited by any suitable method known in the art, such as spinning, CVD, PECVD, HDP-CVD, or the like. The metallization patterns 654 may be formed in the dielectric layer 652, for example, by using photolithography techniques to deposit and pattern a photoresist material on the dielectric layer 652 to expose portions of the dielectric layer 652 that are to become the metallization pattern 654. An etch process, such as an anisotropic dry etch process, may be used to create recesses and/or openings in the dielectric layer 652 corresponding to the exposed portions of the dielectric layer 652. The recesses and/or openings may be lined with a diffusion barrier layer and filled with a conductive material. The diffusion barrier layer may comprise one or more layers of TaN, Ta, TiN, Ti, CoW, or the like, deposited by ALD, or the like, and the conductive material may comprise copper, aluminum, tungsten, silver, and combinations thereof, or the like, deposited by CVD, PVD, plating, or the like. Any excessive diffusion barrier layer and/or conductive material on the dielectric layer may be removed, such as by using a CMP.

Then, in some embodiments, a plurality of electrical connectors 660 are also formed the metallization patterns 654 and are electrically coupled to the through vias 620. The electrical connectors 660 are formed at the top surface of the redistribution structure on the metallization patterns 654. In some embodiments, the metallization patterns 654 include UBMs. In the illustrated embodiment, the pads are formed in openings of the dielectric layers 652 of the redistribution structure. In another embodiment, the pads (UBMs) can extend through an opening of a dielectric layer 652 of the redistribution structure and also extend across the top surface of the redistribution structure.

In some embodiments, the electrical connectors 660 are solder balls and/or bumps, such as ball grid array (BGA) balls, C4 micro bumps, ENIG formed bumps, ENEPIG formed bumps, or the like. The electrical connectors 660 may include a conductive material such as solder, copper, aluminum, gold, nickel, silver, palladium, tin, the like, or a combination thereof. In some embodiments, the electrical connectors 660 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the electrical connectors 660 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 660. The metal cap layer may include nickel, tin, tin-lead, gold, silver, palladium, indium, nickel-palladium-gold, nickel-gold, the like, or a combination thereof and may be formed by a plating process. The electrical connectors 660 may be used to bond to an additional electrical component, which may be a semiconductor substrate, a package substrate, a Printed Circuit Board (PCB), or the like.

Figure 29:
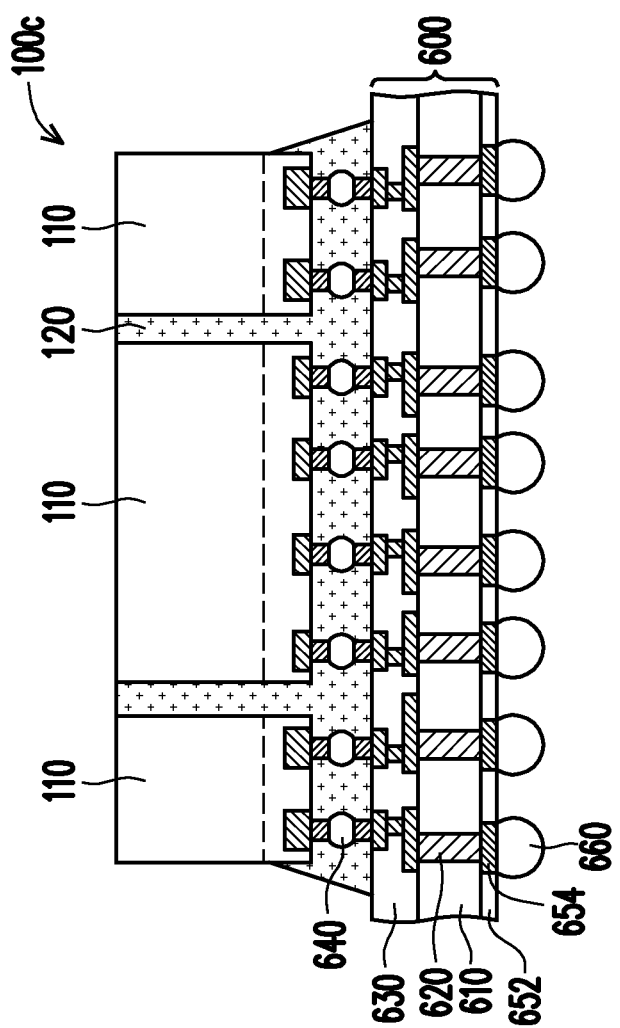

Referring now to FIG. 29, then, the interposer 600 and the encapsulating material (if any) are singulated along scribe lines to form a package structure 100c. The package structure 100c includes, among other things, the device dies 110, the filling material 170, and the interposer 600. The singulation may be performed by sawing, dicing, or the like.

Figure 30:
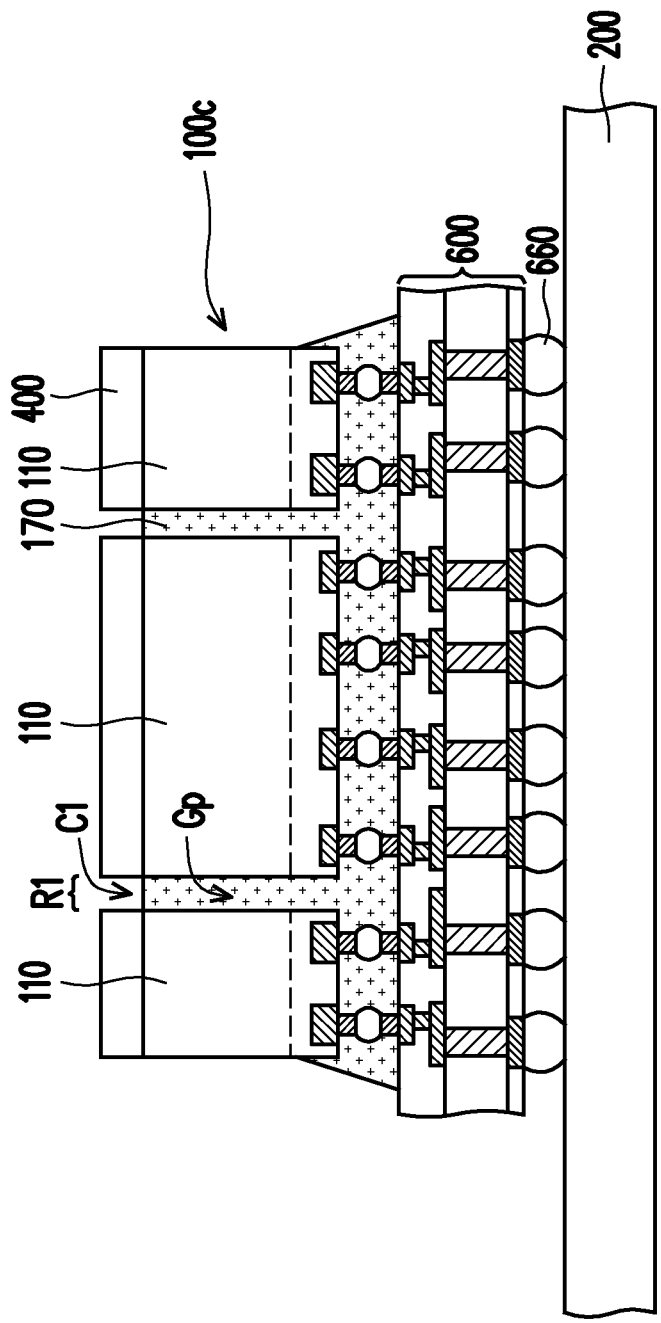

With reference now to FIG. 30, after the package structure 100c is formed, the package structure 100c may be disposed on a substrate 200 through, for example, a pick and place technique. In some embodiments, the connectors 660 are aligned to, and are put against, bond pads of the substrate 200. The connectors 660 may be reflowed to create a bond between the substrate 200 and the package structure 100c. The substrate 200 may include a package substrate, such as a build-up substrate including a core therein, a laminate substrate including a plurality of laminated dielectric films, a PCB, or the like. The substrate 200 may include electrical connectors (not shown), such as solder balls, opposite the component package to allow the substrate 200 to be mounted to another device.

In some embodiments, an underfill material (not illustrated) can be dispensed between the package structure 100c and the substrate 200 and surrounding the connectors 660. The underfill material may be any acceptable material, such as a polymer, epoxy, molding underfill, or the like. In some embodiments, the underfill material may be the same material as the filling material 170. In other embodiments, the underfill material may be the different material from the filling material 170.

Then, a thermal spreader layer 400 may be provided over the package structure 100*c* to facilitate the heat dissipation of the package structure 100*c*. In some embodiments, the thermal spreader layer 400*c* may include a thermal interface material (TIM). For example, the thermal spreader layer 400 includes any suitable thermally conductive material such as a polymer having a good thermal conductivity. In one embodiment, the thermal spreader layer 400 may include a metal TIM, which may be in sheet form or in gel form. The composition of the metal TIM may include indium (In), gallium (Ga), tin (Sn), silver (Ag), gold (Au), copper (Cu), bismuth (Bi), zinc (Zn), etc. The disclosure is not limited thereto. In some embodiments, the young's modulus of the metal TIM is substantially smaller than $10^8$ psi, and is substantially greater than 1 psi.

Accordingly, in some embodiments, the thermal spreader layer 400 has a profile that is discontinuous in thickness at a gap region R1, which is aligned with the gap Gp between device dies 110. In other words, the thermal spreader layer 400 may include at least one gap region R1 (two gap regions R1 are illustrated, but not limited thereto), and a thickness of the thermal spreader layer 400 at the gap region R1 is different from a thickness T1) of the thermal spreader layer 400 at other region (e.g., a die region that is in contact with the device dies 110). In some embodiments, the thickness of the thermal spreader layer 400 at the gap region R1 is substantially thinner than the thickness T1 of the thermal spreader layer 400 at other region. Accordingly, by reducing the thickness of the thermal spreader layer 400 at the gap region R1, elasticity and resiliency of the thermal spreader layer 400 around the gap region is improved, so certain thermal stress in the semiconductor package can be released. Moreover, with such arrangement, the thermal spreader layer 400 is separated from (e.g., not in contact with) the filling material 170, which is usually lower in young's modulus, so the thermal stress between the device dies 110 can be further reduced. The young's modulus of the filling material 170 is substantially smaller than the young's modulus of the thermal spreader layer 400. For example, the young's modulus of the filling material 170 is substantially smaller than $10^6$ psi, and is substantially greater than 0.1 psi.

In addition, at least one concave C1 is defined by the discontinuous thickness profile of the thermal spreader layer 400, which provides air channel and reduce void formation in thermal spreader layer 400. The concaves C1 are aligned with the gaps Gp respectively. In some embodiments, the concaves C1 face the gaps Gp respectively and extend along a thickness direction of the thermal spreader layer 400. In some embodiments, a depth of the concave C1 is substantially greater than 10% of a maximum thickness T1 (the thickness at the die region contacting the device dies 110) of the thermal spreader layer 400, and may be substantially equal to or smaller than the maximum thickness T1 of the thermal spreader layer 400. In the embodiment shown in FIG. 7, the thickness of the thermal spreader layer 400 at the gap region R1 is substantially equal to zero. In other words, the thermal spreader layer 400 is a discontinuous layer (i.e., a segmental layer) that reveals the filling material 170 underneath. That is, the concaves C1 extend through the thermal spreader layer 400. In such embodiments, the thermal spreader layer 400 may be in a sheet form and the thermal spreader sheet is cut in desired sizes to be attached to the back surface of the device die 110 and expose the filling material 170. In other embodiments, the thermal spreader layer 400 may be in a gel form and the thermal spreader gel is dispensed in a desired pattern to cover the back surface of the device die 110 and expose the filling material 170. The disclosure is not limited thereto. It is noted that, even though the segmental thermal spreader layer 400 is illustrated herein, other forms of thermal spreader layer, such as thermal spreader layer 400*a*, 400*b* in the previous embodiments, or any other suitable thermal spreader layers with thickness variations, may also be applied to the semiconductor package. The disclosure is not limited thereto.

Figure 31:
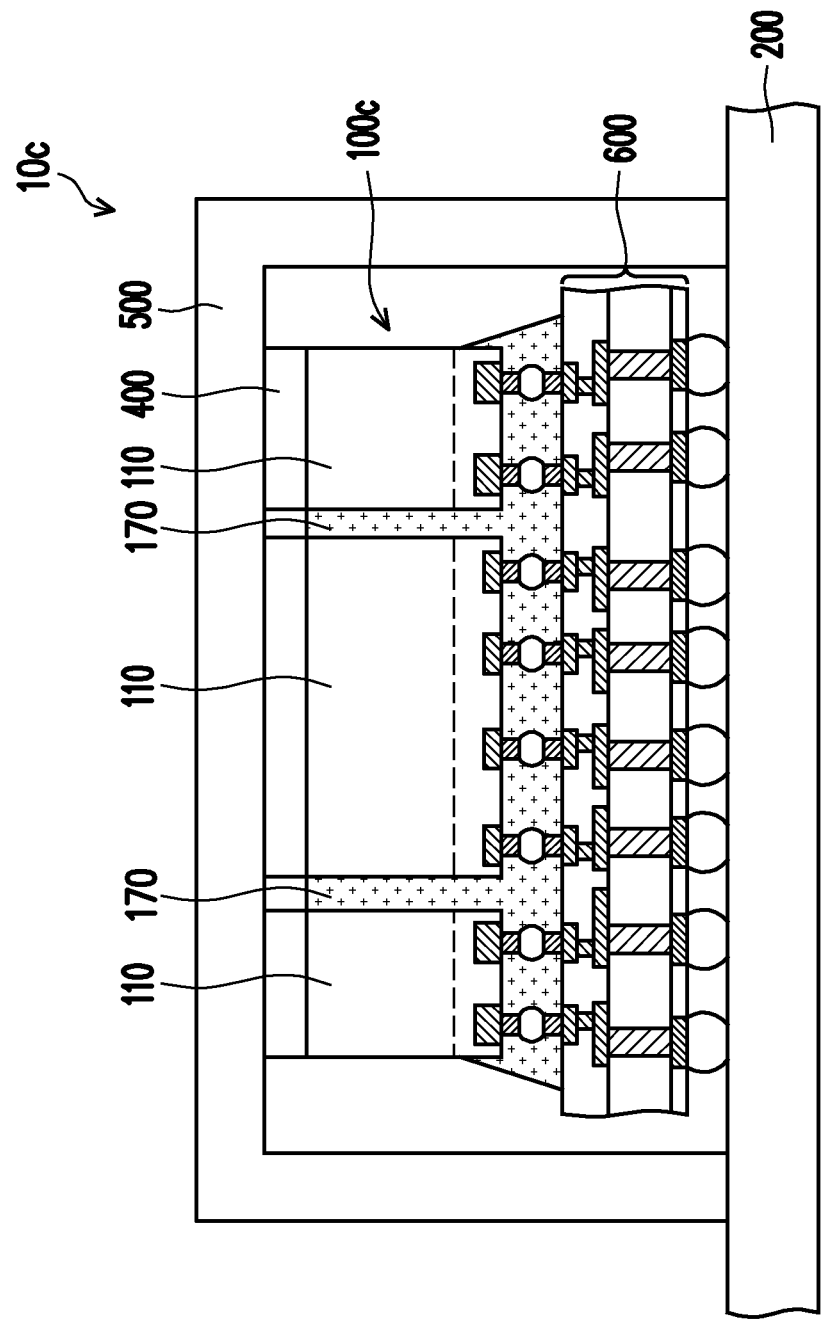

Referring to FIG. 31, in some embodiments, a lid structure 500 is then disposed over substrate 200 and covering the device dies 110 of the package structure 100*c*. To reduce the interface thermal resistance between the device dies 110 and the lid structure 500 as low as possible and to stably bond the device dies 110 and the lid structure 500, the thermal spreader layer 400 is disposed between and in contact with the lid structure 500 and the device dies 110 to facilitate the heat dissipation of the device dies 110. To enhance the structural strength of the semiconductor package 10, a fixing element 510, such as a solder alloy, may be used to bond the substrate 200 and the lid structure 500. In other embodiments, the bond of the substrate 200 and the lid structure 500 may be accomplished by curing a solder paste or using screws. At the time, the semiconductor package 10*c* is substantially formed. In some embodiments, a material of the lid structure 500 may include metal, ceramic or aluminum base complex material of high thermal conduction. There is coefficient of thermal expansion (CTE) mismatch between, for example, the material typically used for the lid structure 500 (e.g., metal), and the material used for the substrate (e.g., Ajinomoto Build-up Film, ABF, glass fiber). The CTE of the lid structure 500 is usually much smaller than the CTE of the substrate 200. Such CTE mismatch between the lid structure 500 and the substrate 200 causes thermal stress on the device dies 110. Thereby, with the arrangement of the thermal spreader layer 400 having a discontinuous thickness profile, the thermal stress between the device dies 110 can be released.

Based on the above discussions, it can be seen that the present disclosure offers various advantages. It is understood, however, that not all advantages are necessarily discussed herein, and other embodiments may offer different advantages, and that no particular advantage is required for all embodiments.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with some embodiments of the disclosure, a semiconductor package includes a substrate, a package structure, a lid structure, and a thermal spreader layer. The package structure is disposed on the substrate. The package structure includes a plurality of device dies and a filling material filling a gap between adjacent two of the plurality of device dies. The lid structure is disposed over substrate and covers the package structure. The thermal spreader layer is disposed between the lid structure and the package structure. The thermal spreader layer has a profile that is discontinuous in thickness at a gap region aligned with the gap. In an embodiment, a thickness of the thermal spreader layer at the gap region is substantially thinner than a thickness of the thermal spreader layer at other region. In an embodiment, a thickness of the thermal spreader layer at the gap region is substantially equal to zero. In an embodiment, a young's modulus of the thermal spreader layer is substantially greater than a young's modulus of the filling material. In an embodiment, the filling material comprising a protruding portion protruding from back surfaces of the plurality of device dies and fills a space defined by thickness discontinuity of the thermal spreader layer at the gap region. In an embodiment, the semiconductor package further includes a dam structure disposed on the filling material and fills a space defined by thickness discontinuity of the thermal spreader layer at the gap region. In an embodiment, a young's modulus of the thermal spreader layer is substantially greater than a young's modulus of the dam structure. In an embodiment, a thickness of the dam structure is substantially greater than 10% of a maximum thickness of the thermal spreader layer. In an embodiment, the thermal spreader layer includes a metal thermal interface material.

In accordance with some embodiments of the disclosure, a semiconductor package includes a redistribution structure, a plurality of device dies over the redistribution structure, a filling material filling a gap between adjacent two of the plurality of device dies, a lid structure covering the plurality of device dies, and a thermal spreader layer disposed between the lid structure and the plurality of device dies. The thermal spreader layer includes a concave aligned with the gap. In an embodiment, the concave faces the gap and extends along a thickness direction of the thermal spreader layer. In an embodiment, the concave extends through the thermal spreader layer. In an embodiment, the filling material includes a protruding portion protruding from back surfaces and fills the concave. In an embodiment, the semiconductor package further includes a dam structure disposed on the filling material and fills the concave. In an embodiment, a depth of the concave is substantially greater than 10% of a maximum thickness of the thermal spreader layer. In an embodiment, the semiconductor package further includes a substrate, wherein the redistribution structure and the lid structure are bonded onto the substrate.

In accordance with some embodiments of the disclosure, a manufacturing method of a semiconductor package includes the following steps. A package structure is provided over a substrate, wherein the package structure includes a plurality of device dies and a filling material filling a gap between adjacent two of the plurality of device dies. A thermal spreader layer is provided over the package structure, wherein the thermal spreader layer has a profile that is discontinuous in thickness at a gap region aligned with the gap. A lid structure is provided over the substrate and in contact with the thermal spreader layer. In an embodiment, the manufacturing method of the semiconductor package further includes: before the thermal spreader layer is provided over the package structure, performing a thinning process to the plurality of device dies, such that the filling material protrudes from back surfaces of the plurality of device dies. In an embodiment, the thinning process comprises an etching process. In an embodiment, the manufacturing method of the semiconductor package further includes: before the thermal spreader layer is provided over the package structure, forming a dam structure on the filling material, wherein the thermal spreader layer encapsulate the dam structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
  a substrate;
  a package structure disposed on the substrate, wherein the package structure comprises a plurality of device dies, a filling material filling a gap between adjacent two of the plurality of device dies;
  a lid structure disposed over substrate and covering the package structure; and
  a thermal spreader layer disposed between the lid structure and the package structure, wherein the thermal spreader layer has a profile that is discontinuous in thickness at a gap region corresponding to the gap, and a thickness of the thermal spreader layer at the gap region is greater than zero and substantially thinner than a thickness of the thermal spreader layer at other regions.

2. The semiconductor package as claimed in claim 1, wherein a thickness of the thermal spreader layer at the gap region is substantially thinner than a thickness of the thermal spreader layer at other region.

3. The semiconductor package as claimed in claim 1, wherein a thickness of the thermal spreader layer at the gap region is substantially equal to zero.

4. The semiconductor package as claimed in claim 1, wherein a young's modulus of the thermal spreader layer is substantially greater than a young's modulus of the filling material.

5. The semiconductor package as claimed in claim 1, wherein the filling material comprising a protruding portion protruding from back surfaces of the plurality of device dies and fills a space defined by thickness discontinuity of the thermal spreader layer at the gap region.

6. The semiconductor package as claimed in claim 1, further comprising a dam structure disposed on the filling material and fills a space defined by thickness discontinuity of the thermal spreader layer at the gap region.

7. The semiconductor package as claimed in claim 6, wherein a young's modulus of the thermal spreader layer is substantially greater than a young's modulus of the dam structure.

8. The semiconductor package as claimed in claim 7, wherein a thickness of the dam structure is substantially greater than 10% of a maximum thickness of the thermal spreader layer.

9. The semiconductor package as claimed in claim 1, wherein the thermal spreader layer comprises a metal thermal interface material.

10. A semiconductor package, comprising:
  a redistribution structure;
  a plurality of device dies over the redistribution structure;

a filling material filling a gap between adjacent two of the plurality of device dies;

a lid structure covering the plurality of device dies; and a thermal spreader layer disposed between the lid structure and the plurality of device dies, wherein the thermal spreader layer comprises a concave corresponding to the gap, the filling material comprises a protruding portion filling the concave, and the thermal spreader layer covering the protruding portion.

11. The semiconductor package as claimed in claim 10, wherein the concave faces the gap and extends along a thickness direction of the thermal spreader layer.

12. The semiconductor package as claimed in claim 10, wherein the concave extends through the thermal spreader layer.

13. The semiconductor package as claimed in claim 10, wherein the filling material comprising a protruding portion protruding from back surfaces and fills the concave.

14. The semiconductor package as claimed in claim 10, further comprising a dam structure disposed on the filling material and fills the concave.

15. The semiconductor package as claimed in claim 14, wherein a depth of the concave is substantially greater than 10% of a maximum thickness of the thermal spreader layer.

16. The semiconductor package as claimed in claim 10, further comprising a substrate, wherein the redistribution structure and the lid structure are bonded onto the substrate.

17. A semiconductor package, comprising:
a redistribution structure;
a plurality of device dies over the redistribution structure;
a filling material filling a gap between adjacent two of the plurality of device dies;
a lid structure covering the plurality of device dies; and
a thermal spreader layer disposed between the lid structure and the plurality of device dies, wherein the thermal spreader layer comprises a neck portion extending over the gap, and a thickness of the thermal spreader layer at the neck portion is substantially smaller than a primary thickness of the thermal spreader layer.

18. The semiconductor package as claimed in claim 17, wherein the thermal spreader layer covers a top surface of the filling material.

19. The semiconductor package as claimed in claim 17, further comprising an encapsulating material encircling the plurality of device dies and the filling material, wherein the thermal spreader layer covers a top surface of the encapsulating material.

20. The semiconductor package as claimed in claim 17, further comprising a dam structure disposed on the filling material and fills a space defined by a thickness discontinuity of the thermal spreader layer at the neck portion, and a material of the dam structure is different from a material of the filling material.

* * * * *